United States Patent
Guo et al.

(10) Patent No.: US 12,425,125 B2
(45) Date of Patent: Sep. 23, 2025

(54) TRANSPORT BLOCK SIZE DETERMINATION

(71) Applicant: ZTE Corporation, Guangdong (CN)

(72) Inventors: Qiujin Guo, Shenzhen (CN); Jin Xu, Shenzhen (CN); Chulong Liang, Shenzhen (CN); Jun Xu, Shenzhen (CN); Jian Kang, Shenzhen (CN); Qiang Fu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 306 days.

(21) Appl. No.: 18/154,266

(22) Filed: Jan. 13, 2023

(65) Prior Publication Data

US 2023/0179321 A1     Jun. 8, 2023

Related U.S. Application Data

(63) Continuation of application No. PCT/CN2020/102084, filed on Jul. 15, 2020.

(51) Int. Cl.
    *H04L 1/00*     (2006.01)

(52) U.S. Cl.
    CPC .......... *H04L 1/0002* (2013.01); *H04L 1/0007* (2013.01)

(58) Field of Classification Search
None
See application file for complete search history.

(56) References Cited

U.S. PATENT DOCUMENTS

| | | | |
|---|---|---|---|
| 2017/0215186 A1* | 7/2017 | Chen | H04L 5/0048 |
| 2019/0109752 A1 | 4/2019 | Zhang et al. | |
| 2019/0158221 A1 | 5/2019 | Sarkis et al. | |
| 2019/0312708 A1 | 10/2019 | Bai et al. | |
| 2020/0059317 A1* | 2/2020 | Patel | H04L 1/0068 |

(Continued)

FOREIGN PATENT DOCUMENTS

| | | |
|---|---|---|
| CN | 108809375 A | 11/2018 |
| CN | 110915153 A | 3/2020 |

(Continued)

OTHER PUBLICATIONS

International Search Report and Written Opinion for International Application No. PCT/CN2020/102084, mailed on Apr. 9, 2021 (10 pages).

(Continued)

*Primary Examiner* — The Hy Nguyen
(74) *Attorney, Agent, or Firm* — Perkins Coie LLP

(57) ABSTRACT

The present application relates to methods, systems, and devices related to digital wireless communication, and more specifically, to techniques related to determining a transport block size. In one exemplary aspect, a method for wireless communication is disclosed. The method includes receiving, by a terminal, a first message that identifies a first coding rate and a second coding rate. The method also includes performing, by the terminal, a first operation relating to a first coding operation and using the first coding rate. The method also includes performing, by the terminal, a second operation relating to a second coding operation and using the second coding rate. The method also includes transmitting or receiving, by the terminal, a second message using information related to the first operation and/or the second operation.

20 Claims, 19 Drawing Sheets

(56) References Cited

U.S. PATENT DOCUMENTS

| | | | |
|---|---|---|---|
| 2020/0177308 A1 | 6/2020 | Lee et al. | |
| 2020/0235759 A1* | 7/2020 | Ye | H03M 13/6516 |
| 2021/0218607 A1* | 7/2021 | Ait Aoudia | G06F 17/16 |
| 2021/0337467 A1* | 10/2021 | Li | H04W 72/04 |
| 2021/0368523 A1* | 11/2021 | Yoshioka | H04W 72/0446 |
| 2023/0344555 A1* | 10/2023 | Yuan | H04L 1/189 |

FOREIGN PATENT DOCUMENTS

| | | | |
|---|---|---|---|
| CN | 110959264 A | 4/2020 | |
| CN | 111164915 A | 5/2020 | |
| CN | 111181652 A | 5/2020 | |
| CN | 111357219 A | 6/2020 | |
| CN | 111357372 A | 6/2020 | |
| EP | 3648381 A1 | 5/2020 | |
| JP | 2019-016826 A | 1/2019 | |
| JP | 2019-75835 A | 5/2019 | |
| WO | WO-2019191973 A1 * | 10/2019 | H04L 1/0007 |

OTHER PUBLICATIONS

Zte et al., "Remaining details of LDPC coding," 3GPP TSG RAN WG1 Meeting #91, R1-1721406, Reno, USA, Nov. 27-Dec. 1, 2017 (13 pages).

Qualcomm Inc., "TBS and Base-graph Determination," 3GPP TSG RAN WG1 Meeting 91, R1-1720699, Nov. 27-Dec. 1, 2017 (10 pages).

Extended European Search Report for European Patent Application No. 20945413.1, mailed Sep. 25, 2023 (7 pages).

Office Action for Japanese Patent Application No. 2023-502676, with English summary, mailed Dec. 22, 2023 (7 pages).

Zte et al., "Remaining details of LDPC coding," 3GPP TSG RAN WG1 Meeting #91, R1-1721406, Reno, USA, Nov. 27-Dec. 1, 2017 (14 pages).

Office Action for Chinese Patent Application No. 202080102858.2, mailed Aug. 6, 2024 (19 pages).

* cited by examiner

TRANSPORT BLOCK SIZE DETERMINATION

CROSS REFERENCE TO RELATED APPLICATIONS

This patent document is a continuation of and claims benefit of priority to International Patent Application No. PCT/CN2020/102084, filed on Jul. 15, 2020. The entire content of the before-mentioned patent application is incorporated by reference as part of the disclosure of this application.

TECHNICAL FIELD

This patent document is directed generally to wireless communications.

BACKGROUND

Mobile communication technologies are moving the world toward an increasingly connected and networked society. The rapid growth of mobile communications and advances in technology have led to greater demand for capacity and connectivity. Other aspects, such as energy consumption, device cost, spectral efficiency, and latency are also important to meeting the needs of various communication scenarios. Various techniques, including new ways to provide higher quality of service, are being discussed.

SUMMARY

This document discloses methods, systems, and devices related to digital wireless communication, and more specifically, to techniques related to determining a transport block size.

In one exemplary aspect, a method for wireless communication is disclosed. The method includes receiving, by a terminal, a first message that identifies a first coding rate and a second coding rate. The method also includes performing, by the terminal, a first operation relating to a first coding operation and using the first coding rate. The method also includes performing, by the terminal, a second operation relating to a second coding operation and using the second coding rate. The method also includes transmitting or receiving, by the terminal, a second message using information related to the first operation and/or the second operation.

In another exemplary aspect, a wireless communications apparatus comprising a processor is disclosed. The processor is configured to implement a method described herein.

In yet another exemplary aspect, the various techniques described herein may be embodied as processor-executable code and stored on a computer-readable program medium.

The details of one or more implementations are set forth in the accompanying attachments, the drawings, and the description below. Other features will be apparent from the description and drawings, and from the clauses.

DETAILED DESCRIPTION

Figure 1A:
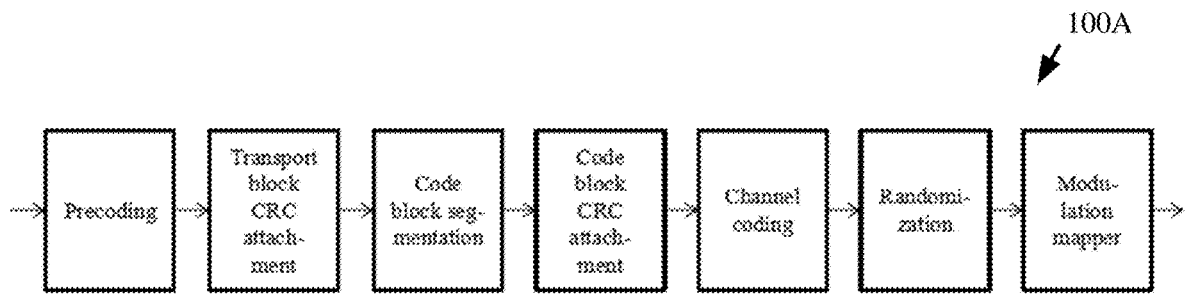
FIGS. 1A-H illustrate examples for the precoding between a transport block CRC attachment and a code block CRC attachment.
Figure 1B:
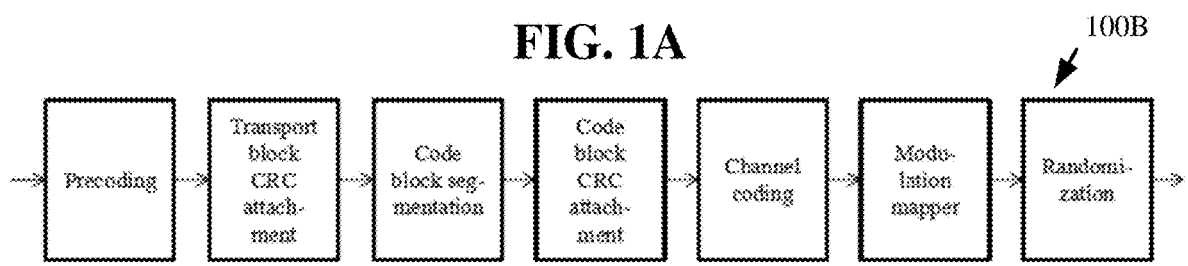

The development of the new generation of wireless communication—5G New Radio (NR) communication—is a part of a continuous mobile broadband evolution process to meet the requirements of increasing network demand. NR will provide greater throughput to allow more users connected at the same time. Other aspects, such as energy consumption, device cost, spectral efficiency, and latency are also important to meeting the needs of various communication scenarios.

In the 3rd Generation Partnership Project (3GPP) standards, high-order quadrature amplitude modulation (QAM) constellation modulation has been used to improve spectral efficiency since the 3G system. However, because of the non-linearity of transmission medium, the marginal benefits obtained in higher order QAM constellations are gradually disappearing. Therefore, other enhanced channel coding and modulation schemes may be approved to improve efficiency for higher order QAM.

For example, Probabilistic amplitude shaping (PAS), which is a low-complexity probabilistic shaping (PS) scheme, can achieve an frame error rate (FER) around 0.01 within 1.1 dB to the additive white Gaussian noise (AWGN) capacity from 1 bit/dim to 5 bits/dim at a step of 0.1 bits/dim using the DVB-S2 low density parity check (LDPC) codes without iterations between demodulation and decoding. PAS combined with LDPC codes can have coding gains more than 2 dB compared to the current fifth generation (5G) modulation and coding schemes (MCSs) over AWGN channels at some settings.

natural labeling, as non-limiting examples. Table 1 cam provide two specific examples for the labeling of the QPSK constellation $\{1+j, 1-j, -1+j, -1-j\}$, i.e., the labeling 1 and the labeling 3, where $j=\sqrt{-1}$ is the imaginary unit.

TABLE 1

| Examples for labeling ($j = \sqrt{-1}$ is the imaginary unit) | | | | | | | | | |
|---|---|---|---|---|---|---|---|---|---|
| labeling 1 | | labeling 2 | | labeling 3 | | labeling 4 | | labeling 5 | |
| complex value | bit sequence | complex value | bit sequence | complex value | bit sequence | complex value | bit sequence | complex value | bit sequence |
| 1 + j | 00 | 1 | 11 | 1 + j | 0 | 1 | 111 | −1 | 1 |
| 1 − j | 01 | 3 | 10 | 1 − j | 10 | 3 | 1 | | |
| −1 + j | 10 | 5 | 00 | −1 + j | 110 | 5 | 0 | 1 | 0 |
| −1 − j | 11 | 7 | 01 | −1 − j | 111 | 7 | 10 | | |

However, if the enhanced channel coding and modulation scheme is used for the current communication system, the effective code rate for the whole coding link may not be similar to the target code rate determined by the current MCS table and may be related to the code rate of the introduced enhanced coding module. Therefore, the code rate for channel coding may be related to channel quality indicator (CQI) report, MCS indication, code block segmentation, LDPC base graph (BG) selection and transport block size (TBS) determination. Considering the potential impacts on the value of code rate for the whole coding link, some schemes on CQI report, MCS indication, TBS determination and BG selection are disclosed in this disclosure.

In 3GPP 5G, a device, such as a user equipment (UE) or a base station (BS), can partition data bits into transport blocks (TBs) for channel coding and modulation. The number of information bits of the transport block may be referred to as TBS. Channel coding and modulation schemes may be used to encode the information bits into a modulation sequence. A modulation sequence may include a constellation point sequence output from a modulation mapper. A modulation mapper may include a high-order modulation including a labeling of a constellation with the number of constellation points larger than 2. A constellation may include a set of complex values and each complex value is a constellation point. There may be various types of constellations, such as quadrature amplitude modulation (QAM), quadrature phase shift keying (QPSK), phase shift keying (PSK), amplitude shift keying (ASK), and amplitude phase shift keying (MAPSK), as non-limiting examples.

A labeling may include a mapping between a set of bit sequences and a set of complex values. The bits associated to a complex value may be called the label of the complex value. The number of bits in the label of the complex value may be called the length of the label. If all labels have the same length in a labeling, this length may also be called the length of the labeling. A labeling of a constellation is a mapping between a set of bit sequences and the set of constellation points. Table 1 can provide specific examples for labeling, for example, 00 is the label of the value 1+j in the labeling 1 and 0 is the label of the value 5 in the labeling 4. For a given constellation, there can be various types of labeling of the constellation, such as Gray labeling and There may be an amplitude set and a phase set associated to a given modulation mapper. An amplitude set may include a set of non-negative real values. An element in an amplitude set may be called an amplitude. The definition of labeling may also be applied to amplitude sets. This may not be limited to one type of labeling of a given amplitude set. Table 1 can provide two specific examples for labeling of the amplitude set $\{1, 3, 5, 7\}$, i.e., the labeling 2 and the labeling 4. Table 2 can provide the amplitude set as well the corresponding labeling for 16QAM, 64QAM, and 256QAM of 3GPP 5G. An amplitude sequence may include a sequence with each element chosen from an amplitude set. The energy of an amplitude sequence is defined as the sum of the weight of each amplitude in the amplitude sequence. The weight of an amplitude a may include the function value f(α) with f(.) being a monotonic increasing real-value function that maps non-negative real value into non-negative real value. Specific examples for f(α) are $f(\alpha)=\alpha$, $f(\alpha)=\alpha^2$, and $f(\alpha)=2\alpha+1$. The power of a constellation point may include the square of the complex modulus of the constellation point. The power of a modulation sequence may include the sum of the power of each constellation point in the modulation sequence. A phase set may include a set of real values. An element in a phase set is called a phase. The definition of labeling may also be applied to phase sets. There is not limited to one type of labeling of a given phase set. Table 1 may provide an specific example for the labeling of the phase set $\{-1, 1\}$, which is used in the 16QAM, 64QAM, and 256QAM of 3GPP 5G. A phase sequence may include a sequence with each element chosen from a phase set. For QAM constellations in the 3GPP 5G, two pairs of amplitude and phase map to a constellation point with one pair for the real part and the other pair for the imaginary part. Table 3 (a), (b) and (c) and corresponding FIGS. 16A, 16B and 16C, may provide examples for the relation between amplitudes, phases, amplitude set, phase set, constellation, and their labeling.

TABLE 2

Amplitude sets and labeling for QAM constellation

| amplitude in amplitude set $(A_{2i})$ or $(A_{2i+1})$ | $16QAM\left(\alpha = \frac{1}{\sqrt{10}}\right)$ Qm = 4, Qa = 1 label of amplitude $(b_{4i+2})$ or $(b_{4i+3})$ | $64QAM\left(\alpha = \frac{1}{\sqrt{42}}\right)$ Qm = 6, Qa = 2 label of amplitude $(b_{6i+2}, b_{6i+4})$ or $(b_{6i+3}, b_{6i+5})$ | $256QAM\left(\alpha = \frac{1}{\sqrt{170}}\right)$ Qm = 8, Qa = 3 label of amplitude $(b_{8i+2}, b_{8i+4}, b_{8i+6})$ or $(b_{8i+3}, b_{8i+5}, b_{8i+7})$ |
|---|---|---|---|
| $\alpha$ | 0 | 01 | 011 |
| $3\alpha$ | 1 | 00 | 010 |
| $5\alpha$ | N/A | 10 | 000 |
| $7\alpha$ | N/A | 11 | 001 |
| $9\alpha$ | N/A | N/A | 101 |
| $11\alpha$ | N/A | N/A | 100 |
| $13\alpha$ | N/A | N/A | 110 |
| $15\alpha$ | N/A | N/A | 111 |

Theoretically, channel coding and modulation schemes output constellation points with equal probability are not efficient. An efficient scheme should output different constellation points with different probabilities. Specifically, a constellation point with smaller power can appear more frequently than a constellation point with larger power in the output of the channel coding and modulation. In this disclosure, the channel coding and modulation schemes can encode a TB into a modulation sequence with a desired probability for constellation points.

TABLE 3(a)

Figure 16A:
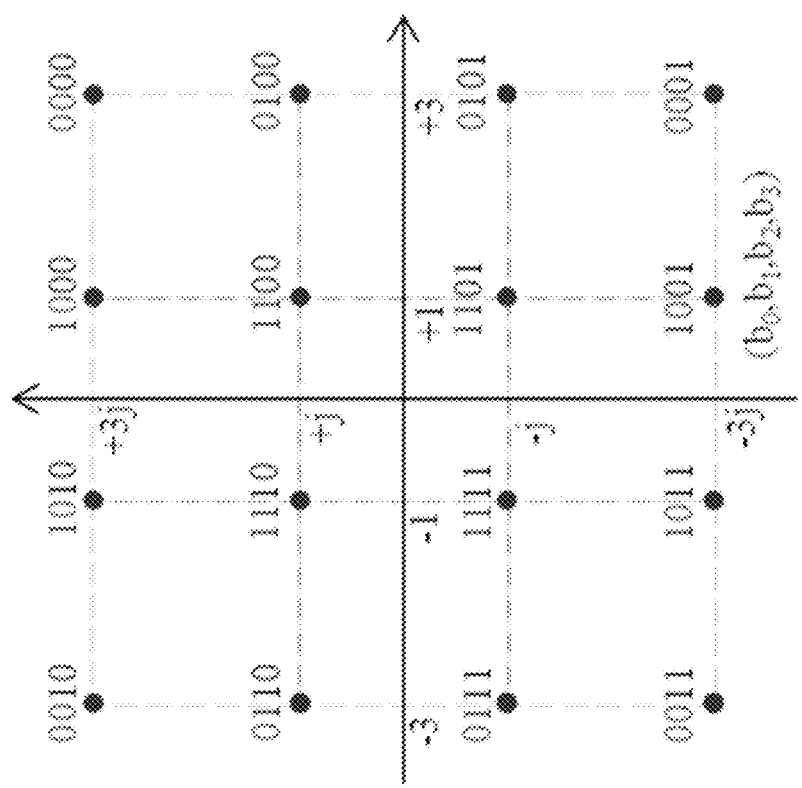
FIGS. 16A, 16B and 16C show constellation drawings.

Example for relation between amplitudes, phases, amplitude set, phase set, constellation, and their labeling for a 16 QAM ($j = \sqrt{-1}$ is the imaginary unit, the constellation is drawn in FIG. 16A)

| constellation point in the constellation (x = $A_0 \cdot \theta_0 + j \cdot A_1 \cdot \theta_1$) | amplitudes $(A_0, A_1)$ in the amplitude set {+1, +3} | phases $(\theta_0, \theta_1)$ in the phase set {−1, +1} | label of constellation point $(b_0, b_1, b_2, b_3)$ | | | |
|---|---|---|---|---|---|---|
| | | | label of the amplitude $A_0$ $(b_0)$ | label of the amplitude $A_1$ $(b_1)$ | label of the phase $\theta_0$ $(b_2)$ | label of the phase $\theta_1$ $(b_3)$ |
| 1 + j | (+1, +1) | (+1, +1) | 1 | 1 | 0 | 0 |
| 1 − j | (+1, +1) | (+1, −1) | 1 | 1 | 0 | 1 |
| −1 + j | (+1, +1) | (−1, +1) | 1 | 1 | 1 | 0 |
| −1 − j | (+1, +1) | (−1, −1) | 1 | 1 | 1 | 1 |
| 1 + 3j | (+1, +3) | (+1, +1) | 1 | 0 | 0 | 0 |
| 1 − 3j | (+1, +3) | (+1, −1) | 1 | 0 | 0 | 1 |
| −1 + 3j | (+1, +3) | (−1, +1) | 1 | 0 | 1 | 0 |
| −1 − 3j | (+1, +3) | (−1, −1) | 1 | 0 | 1 | 1 |
| 3 + j | (+3, +1) | (+1, +1) | 0 | 1 | 0 | 0 |
| 3 − j | (+3, +1) | (+1, −1) | 0 | 1 | 0 | 1 |
| −3 + j | (+3, +1) | (−1, +1) | 0 | 1 | 1 | 0 |
| −3 − j | (+3, +1) | (−1, −1) | 0 | 1 | 1 | 1 |
| 3 + 3j | (+3, +3) | (+1, +1) | 0 | 0 | 0 | 0 |
| 3 − 3j | (+3, +3) | (+1, −1) | 0 | 0 | 0 | 1 |
| −3 + 3j | (+3, +3) | (−1, +1) | 0 | 0 | 1 | 0 |
| −3 − 3j | (+3, +3) | (−1, −1) | 0 | 0 | 1 | 1 |

TABLE 3(b)

Figure 16B:
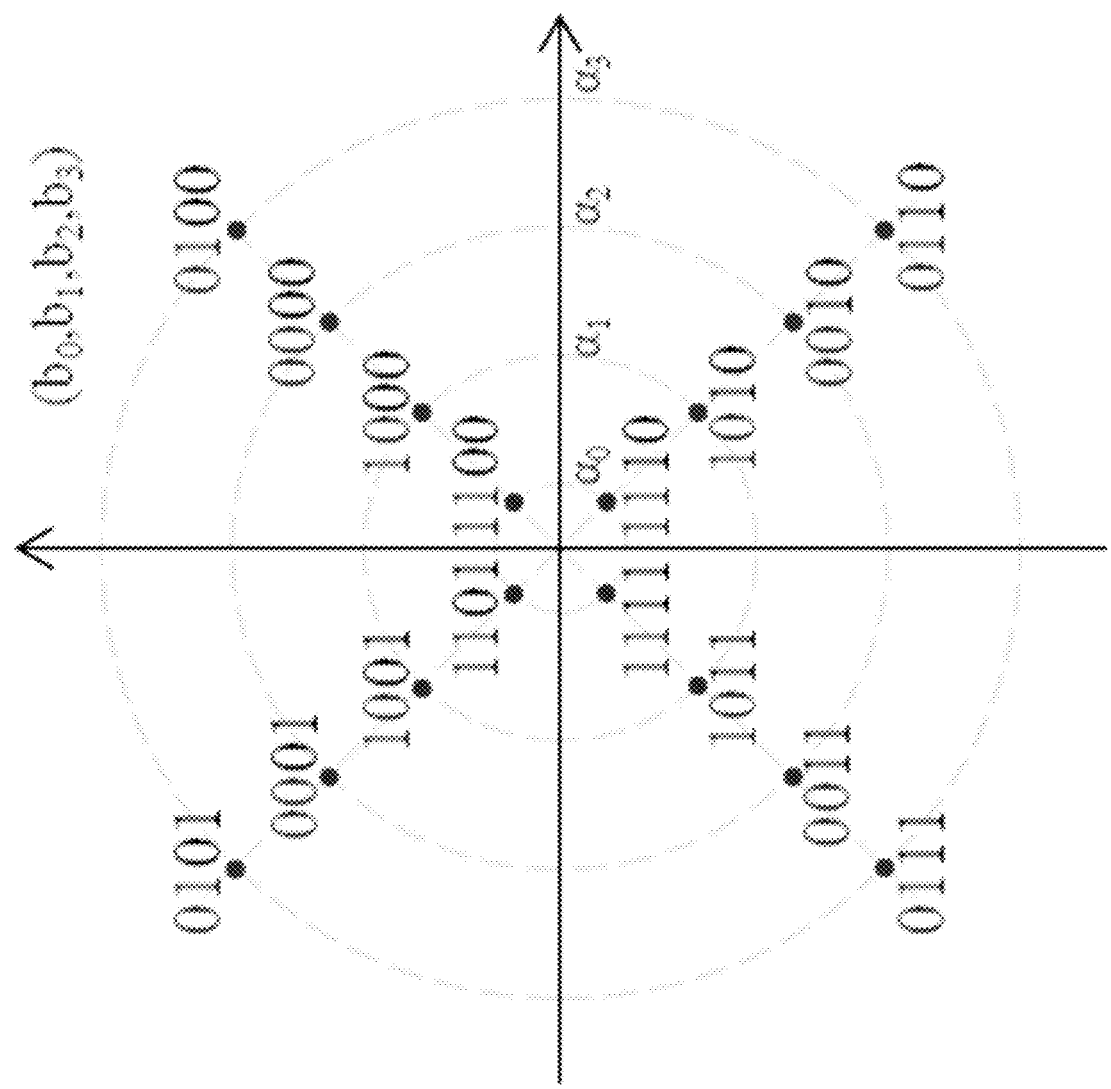

Example for relation between amplitudes, phases, amplitude set, phase set, constellation, and their labeling for a 16APSK (j = $\sqrt{-1}$ is the imaginary unit, the constellation is drawn in FIG. 16B)

| constellation point in the | amplitude $A_0$ in the amplitude set | phase $\theta_0$ in the phase set | label of constellation point ($b_0, b_1, b_2, b_3$) | |
|---|---|---|---|---|
| constellation (x = $A_0 \cdot$ exp(j $\cdot \theta_0$)) | $\{\alpha_0, \alpha_1, \alpha_2, \alpha_3\}$ with $0 < \alpha_0 < \alpha_1 < \alpha_2 < \alpha_3$ | $\{\pi/4, 3\pi/4, 5\pi/4, 7\pi/4\}$ | label of the amplitude $A_0$ ($b_0, b_1$) | label of the phase $\theta_0$ ($b_2, b_3$) |
| $\alpha_0 \cdot$ exp(j $\cdot \pi/4$) | $\alpha_0$ | $\pi/4$ | 11 | 00 |
| $\alpha_0 \cdot$ exp(j $\cdot 3\pi/4$) | $\alpha_0$ | $3\pi/4$ | 11 | 01 |
| $\alpha_0 \cdot$ exp(j $\cdot 5\pi/4$) | $\alpha_0$ | $5\pi/4$ | 11 | 11 |
| $\alpha_0 \cdot$ exp(j $\cdot 7\pi/4$) | $\alpha_0$ | $7\pi/4$ | 11 | 10 |
| $\alpha_1 \cdot$ exp(j $\cdot \pi/4$) | $\alpha_1$ | $\pi/4$ | 10 | 00 |
| $\alpha_1 \cdot$ exp(j $\cdot 3\pi/4$) | $\alpha_1$ | $3\pi/4$ | 10 | 01 |
| $\alpha_1 \cdot$ exp(j $\cdot 5\pi/4$) | $\alpha_1$ | $5\pi/4$ | 10 | 11 |
| $\alpha_1 \cdot$ exp(j $\cdot 7\pi/4$) | $\alpha_1$ | $7\pi/4$ | 10 | 10 |
| $\alpha_2 \cdot$ exp(j $\cdot \pi/4$) | $\alpha_2$ | $\pi/4$ | 00 | 00 |
| $\alpha_2 \cdot$ exp(j $\cdot 3\pi/4$) | $\alpha_2$ | $3\pi/4$ | 00 | 01 |
| $\alpha_2 \cdot$ exp(j $\cdot 5\pi/4$) | $\alpha_2$ | $5\pi/4$ | 00 | 11 |
| $\alpha_2 \cdot$ exp(j $\cdot 7\pi/4$) | $\alpha_2$ | $7\pi/4$ | 00 | 10 |
| $\alpha_3 \cdot$ exp(j $\cdot \pi/4$) | $\alpha_3$ | $\pi/4$ | 01 | 00 |
| $\alpha_3 \cdot$ exp(j $\cdot 3\pi/4$) | $\alpha_3$ | $3\pi/4$ | 01 | 01 |
| $\alpha_3 \cdot$ exp(j $\cdot 5\pi/4$) | $\alpha_3$ | $5\pi/4$ | 01 | 11 |
| $\alpha_3 \cdot$ exp(j $\cdot 7\pi/4$) | $\alpha_3$ | $7\pi/4$ | 01 | 10 |

TABLE 3(c)

Figure 16C:
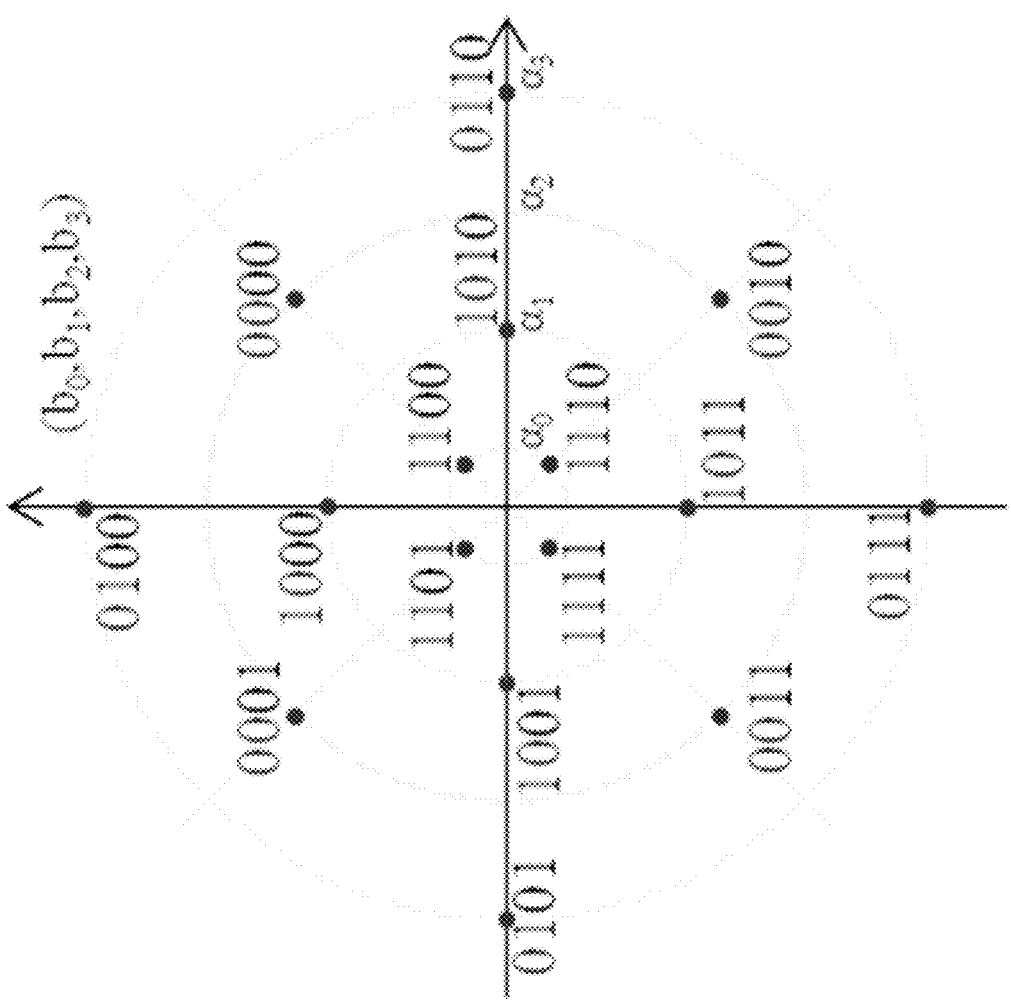

Example for relation between amplitudes, phases, amplitude set, phase set, constellation, and their labeling for a 16APSK (j = $\sqrt{-1}$ is the imaginary unit, the constellation is drawn in FIG. 16C)

| constellation point in the | amplitude $A_0$ in the | phase $\theta_0$ in the phase set | label of constellation point ($b_0, b_1, b_2, b_3$) | |
|---|---|---|---|---|
| constellation (x = $A_0 \cdot$ exp(j $\cdot \theta_0$)) with $\Delta = \pi/4$ | amplitude set $\{\alpha_0, \alpha_1, \alpha_2, \alpha_3\}$ with $0 < \alpha_0 < \alpha_1 < \alpha_2 < \alpha_3$ | $\{\pi/4, 3\pi/4, 5\pi/4, 7\pi/4\}$ | label of the amplitude $A_0$ ($b_0, b_1$) | label of the phase $\theta_0$ ($b_2, b_3$) |
| $\alpha_0 \cdot$ exp(j $\cdot \pi/4$) | $\alpha_0$ | $\pi/4$ | 11 | 00 |
| $\alpha_0 \cdot$ exp(j $\cdot 3\pi/4$) | $\alpha_0$ | $3\pi/4$ | 11 | 01 |
| $\alpha_0 \cdot$ exp(j $\cdot 5\pi/4$) | $\alpha_0$ | $5\pi/4$ | 11 | 11 |
| $\alpha_0 \cdot$ exp(j $\cdot 7\pi/4$) | $\alpha_0$ | $7\pi/4$ | 11 | 10 |
| $\alpha_1 \cdot$ exp(j $\cdot \pi/4 + j \cdot \Delta$) | $\alpha_1$ | $\pi/4$ | 10 | 00 |
| $\alpha_1 \cdot$ exp(j $\cdot 3\pi/4 + j \cdot \Delta$) | $\alpha_1$ | $3\pi/4$ | 10 | 01 |
| $\alpha_1 \cdot$ exp(j $\cdot 5\pi/4 + j \cdot \Delta$) | $\alpha_1$ | $5\pi/4$ | 10 | 11 |
| $\alpha_1 \cdot$ exp(j $\cdot 7\pi/4 + j \cdot \Delta$) | $\alpha_1$ | $7\pi/4$ | 10 | 10 |
| $\alpha_2 \cdot$ exp(j $\cdot \pi/4$) | $\alpha_2$ | $\pi/4$ | 00 | 00 |
| $\alpha_2 \cdot$ exp(j $\cdot 3\pi/4$) | $\alpha_2$ | $3\pi/4$ | 00 | 01 |
| $\alpha_2 \cdot$ exp(j $\cdot 5\pi/4$) | $\alpha_2$ | $5\pi/4$ | 00 | 11 |
| $\alpha_2 \cdot$ exp(j $\cdot 7\pi/4$) | $\alpha_2$ | $7\pi/4$ | 00 | 10 |
| $\alpha_3 \cdot$ exp(j $\cdot \pi/4 + j \cdot \Delta$) | $\alpha_3$ | $\pi/4$ | 01 | 00 |
| $\alpha_3 \cdot$ exp(j $\cdot 3\pi/4 + j \cdot \Delta$) | $\alpha_3$ | $3\pi/4$ | 01 | 01 |
| $\alpha_3 \cdot$ exp(j $\cdot 5\pi/4 + j \cdot \Delta$) | $\alpha_3$ | $5\pi/4$ | 01 | 11 |
| $\alpha_3 \cdot$ exp(j $\cdot 7\pi/4 + j \cdot \Delta$) | $\alpha_3$ | $7\pi/4$ | 01 | 10 |

In the following, the size of a set, or the set size, may be the number of elements in the set. The notation |_z_| for real values may stand for the largest integer not greater than z. The notation |-z-| for real values stands for the smallest integer not less than z. The notation round(z) for real values may stand for the nearest integer to z. The notation exp(.) may be the natural exponential function. The notation "mod" may be the modulo operation. The notation π may be the Pi.

In this disclosure, channel coding and modulation for a transport block may comprise the following steps without a specific order: channel coding, specific coding, transport block CRC attachment, code block segmentation, code block CRC attachment. The channel coding may be one of: a low-density parity-check code, a polar code, a turbo code, a convolutional code. The specific coding may include a process comprising at least one of: a bit-to-symbol encoding and an symbol-to-bit conversion.

Introduction on TBS Determination

In 5G NR, for PDSCH/PUSCH assigned by a PDCCH with a scheduling downlink control information (DCI) format with CRC scrambled by a plurality of RNTIs, the UE may first determine the target code rate (R) and the modulation order ($Q_m$) based on the value of MCS index ($I_{MCS}$) indicated by a DCI, and use the number of layers (v) and the number of allocated PRBs ($n_{PRB}$) to determine to the TBS. The plurality of MCS tables used for PDSCH and PUSCH are shown in Table A1-A3 and Table B1-B2 in Appendix. Each MCS entry may include a MCS index, a target code rate (R), a modulation order ($Q_m$) and the corresponding spectrum efficiency (SE). TBS determination procedure may include determining the number of RES ($N_{RE}$) within the slot and/or determining the intermediate number of information bits ($N_{info}$) based on $N_{info} = N_{RE} \cdot R \cdot Q_m \cdot v$. When $N_{info} \leq 3824$, TBS may be quantized the intermediate number of information bits by $2^n$ to obtain $N'_{info}$. Wherein n is an integer, which is not smaller than 3, and is related to the value of $N_{info}$ and can use a TBS Table find the closest TBS that is not less than $N_{info}'$.

When $N_{info} > 3824$, TBS may be quantized the intermediate number of information bits by $2^n$ to obtain $N'_{info}$, wherein n is an integer, which may not be smaller than 6, and is related to the value of $N_{info}$ and can use the target code rate (R) to determine the modifying factor and compute the number of code blocks (C) based on the modifying factor, and the value of ($N'_{info}+24$) should be evenly divided by the value of (8*C).

To obtain the number of code blocks, the UE can first select the LDPC base graph according to the rules shown in Table 4 and then determine the maximum code block size of the selected base graph. For BG1, the maximum code block size may be Kcb=8448, and for BG2, the maximum code block size is Kcb=3840. For a TB, the total number of bits after cyclic redundancy check (CRC) attachment may be TBS+$L_{TB\_CRC}$, where $L_{TB\_CRC}$=24 bits. If the TBS+$L_{TB\_CRC}$ is not larger than Kcb, the number of code block may be 1 and no additional CRC sequence may be attached to the single code block; otherwise, the total number of code block is determined by C=ceil((TBS+$L_{TB\_CRC}$)/(Kcb−$L_{CB\_CRC}$)) and the total number of bits of each code block is K'=(TBS+$L_{TB\_CRC}$)/C+$L_{CB\_CRC}$.

TABLE 4

Base graph selection for NR-LDPC

| R | ≤292 | 292 < K ≤ 3824 | >3824 |
|---|---|---|---|
| >2/3 | BG2 | BG1 | BG1 |
| 1/4 < R ≤ 2/3 | BG2 | BG2 | BG1 |
| ≤1/4 | BG2 | BG2 | BG2 |

Introduction to CQI Report

Based on an observation interval in time and frequency, the UE can derive for each CQI value reported in uplink slot the highest CQI index which satisfies that a single PDSCH transport block with a combination of modulation scheme, target code rate and transport block size corresponding to the CQI index, and occupying a group of downlink physical resource blocks termed the channel state information (CSI) reference resource, could be received with a transport block error probability not exceeding a target block error rate corresponding to the CQI table configured by the higher layer parameter. The combination of modulation scheme and transport block size can correspond to a CQI index if the combination could be signaled for transmission on the PDSCH in the CSI reference resource according to the TBS determination, the modulation scheme is indicated by the CQI index, and the combination of transport block size and modulation scheme when applied to the reference resource results in the effective channel code rate which is the closest possible to the code rate indicated by the CQI index. If more than one combination of transport block size and modulation scheme results in an effective channel code rate equally close to the code rate indicated by the CQI index, only the combination with the smallest of such transport block sizes may be relevant.

Introduction to the Specific Coding Operation in the Radio Link Model sequence u as Kd. Denote the length of the first amplitude sequence A as Na. Denote the number of elements in the amplitude set $\Phi$ as Ma. The length of the labeling of the amplitude set $\Phi$, denoted as Qa, can be an integer such that 2 to the power of the integer is greater than or equal to the size of the amplitude set $\Phi$, i.e., $2^{Qa} \geq Ma$.

Further, in a specific example of this embodiment, the symbol-to-bit conversion can convert the first amplitude sequence $A=[A_0, A_1, A_2, \ldots, A_{Na-1}]$ into a second bit sequence $v=[v_0, v_1, v_2, \ldots, v_{Nv-1}]$ according to a labeling of the amplitude set $\Phi$ converting each amplitude $A_i$ into number of bits equal to the length of the labeling of the amplitude set $\Phi$. One of the specific implementations of the symbol-to-bit conversion is that the bits $(v_{i \cdot Qa}, v_{i \cdot Qa+1}, \ldots, v_{i \cdot Qa+Qa-1})$ of the second bit sequence v is the label of the amplitude $A_i$ for $i=0, 1, 2, \ldots, Na-1$.

Further, in a specific example of this embodiment, Table 3 can provide one of the specific implementations of the labeling of the amplitude set $\Phi$ for 16QAM, 64QAM and 256QAM in the 3GPP 5G.

TABLE 5A

Examples for labeling of amplitude where (a) the amplitude set $\Phi = \{1, 2, 6\}$

| Amplitude in $\Phi$ | Labeling 1 (Qa = 2) $(b_0, b_1)$ | Labeling 2 (Qa = 2) $(b_0, b_1)$ | Labeling 3 (Qa = 2) $(b_0, b_1)$ | Labeling 4 (Qa = 2) $(b_0, b_1)$ | Labeling 5 (Qa = 3) $(b_0, b_1, b_2)$ | Labeling 6 (Qa = 3) $(b_0, b_1, b_2)$ | Labeling 7 (Qa = 3) $(b_0, b_1, b_2)$ | Labeling 8 (Qa = 3) $(b_0, b_1, b_2)$ |
|---|---|---|---|---|---|---|---|---|
| 1 | 11 | 11 | 01 | 10 | 111 | 111 | 101 | 101 |
| 2 | 01 | 10 | 10 | 01 | 110 | 101 | 100 | 001 |
| 6 | 00 | 00 | 00 | 00 | 100 | 100 | 001 | 100 |

TABLE 5B

Examples for labeling of amplitude where (b) the amplitude set $\Phi = \{1, 3, 5, 7\}$

| Amplitude in $\Phi$ | Labeling 1 (Qa = 2) $(b_0, b_1)$ | Labeling 2 (Qa = 2) $(b_0, b_1)$ | Labeling 3 (Qa = 2) $(b_0, b_1)$ | Labeling 4 (Qa = 2) $(b_0, b_1)$ | Labeling 5 (Qa = 3) $(b_0, b_1, b_2)$ | Labeling 6 (Qa = 3) $(b_0, b_1, b_2)$ | Labeling 7 (Qa = 3) $(b_0, b_1, b_2)$ | Labeling 8 (Qa = 3) $(b_0, b_1, b_2)$ |
|---|---|---|---|---|---|---|---|---|
| 1 | 11 | 11 | 11 | 01 | 111 | 111 | 110 | 001 |
| 3 | 01 | 10 | 10 | 11 | 110 | 110 | 111 | 011 |
| 5 | 00 | 00 | 01 | 10 | 100 | 101 | 101 | 111 |
| 7 | 10 | 01 | 00 | 00 | 101 | 011 | 100 | 000 |

TABLE 5C

Examples for labeling of amplitude where (c) the amplitude set $\Phi = \{1, 3, 5, 7, 9, 11, 13, 15\}$

| Amplitude in $\Phi$ | Labeling 1 (Qa = 3) $(b_0, b_1, b_2)$ | Labeling 2 (Qa = 3) $(b_0, b_1, b_2)$ | Labeling 3 (Qa = 3) $(b_0, b_1, b_2)$ | Labeling 4 (Qa = 3) $(b_0, b_1, b_2)$ | Labeling 5 (Qa = 3) $(b_0, b_1, b_2)$ | Labeling 6 (Qa = 3) $(b_0, b_1, b_2)$ | Labeling 7 (Qa = 3) $(b_0, b_1, b_2)$ | Labeling 8 (Qa = 3) $(b_0, b_1, b_2)$ |
|---|---|---|---|---|---|---|---|---|
| 1 | 111 | 111 | 111 | 111 | 111 | 111 | 111 | 111 |
| 3 | 110 | 110 | 101 | 101 | 011 | 011 | 011 | 110 |
| 5 | 100 | 010 | 100 | 001 | 001 | 010 | 010 | 101 |
| 7 | 101 | 011 | 110 | 011 | 101 | 110 | 110 | 011 |
| 9 | 001 | 001 | 010 | 010 | 100 | 100 | 100 | 100 |
| 11 | 011 | 101 | 011 | 110 | 110 | 101 | 000 | 010 |
| 13 | 010 | 100 | 001 | 100 | 010 | 001 | 001 | 001 |
| 15 | 000 | 000 | 000 | 000 | 000 | 000 | 101 | 000 |

In a specific example of this embodiment, the bit-to-symbol encoding (namely, the specific coding) can encode a first bit sequence u into a first amplitude sequence A using an amplitude set $\Phi$. Denote the length of the first bit Further, in a specific example of this embodiment, one of the specific implementations of the labeling of the amplitude set $\Phi$ may be that the label of the smallest amplitude in the amplitude set $\Phi$ has bit "1" more than the label of the largest amplitude in the amplitude set Φ. Or, equivalently, the labeling of the constellation of the modulation mapper have the following property: the label of the constellation point with the smallest power has bit "1" more than the label of the constellation point with the largest power in the constellation of the modulation mapper. Table 5A_C may provide specific examples of the label of amplitude for three amplitude sets {1, 2, 6}, {1, 3, 5, 7}, {1, 3, 5, 7, 9, 11, 13, 15} with Qa=2 and 3.

Further, in a specific example of this embodiment, the bit-to-symbol encoding is one of: source coding related encoding, energy threshold encoding, minimum energy encoding, variable-length encoding, and non-linear coding.

Further, in a specific example of this embodiment, the source coding related encoding encodes the first bit sequence u into the first amplitude sequence A according to a probability related parameter.

One of the specific implementations for the probability related parameter can be a probability mass function (PMF) of the amplitude set Φ. One of the specific implementations for using the probability mass function of the amplitude set Φ={φ$_0$, φ$_1$, . . . , φ$_{Ma-1}$} can be to calculate the number of amplitude φ$_i$ appears in the first amplitude sequence A $$Num(\varphi_i) = \left\lfloor Na \cdot \sum_{j=0}^{i} Pr\{\varphi_j\} \right\rfloor - \left\lfloor Na \cdot \sum_{j=0}^{i-1} Pr\{\varphi_j\} \right\rfloor,$$

where the summation in the right is zero for i=0. Take Φ={1, 3, 5} with the probability mass function Pr{1}=0.4, Pr{3}=0.3, Pr{5}=0.3 and Na=5 as an example as follows:
Num(1)=⌊5·Pr{1}⌋=⌊5·0.4⌋=2, Num(3)=⌊5·Pr{1}+5·Pr{3}⌋−⌊5·Pr{1}⌋=⌊5×0.4+5×0.3⌋−2=⌊3.5⌋−⌊2⌋=1, Num(5)=⌊5·Pr{1}+5·Pr{3}+5·Pr{5}⌋−⌊5·Pr{1}+5·Pr{3}⌋=⌊5×0.4+5×0.3+5×0.3⌋−⌊3.5⌋=2.

One of the specific implementations for using the probability mass function of the amplitude set Φ={φ$_0$, φ$_1$, . . . , φ$_{Ma-1}$} may be to calculate the number of amplitude φ appears in the first amplitude sequence A $$Num(\varphi_j) = round\left(Na \cdot \sum_{j=0}^{i} Pr\{\varphi_j\}\right) - round\left(Na \cdot \sum_{j=0}^{i-1} Pr\{\varphi_j\}\right),$$

where the summation in the right is zero for i=0. Take Φ={1, 3, 5} with the probability mass function Pr{1}=0.4, Pr{3}=0.3, Pr{5}=0.3 and Na=5 as an example as follows:
Num(1)=round(5·Pr{1})=round(5·0.4)=2, Num(3)=round(5·Pr{1}+5·Pr{3})−round(5·Pr{1})=round(3.5)−2=2, Num(5)=round(5·Pr{1}+5·Pr{3}+5·Pr{5})−round(5·Pr{1}+5·Pr{3})=5−round(3.5)=1.

With the number of amplitude φ$_i$ appears in the first amplitude sequence A, the first amplitude sequence A may have the number of 1, 3, and 5 being Num(1), Num(3) and Num(5). Using the round(.) operation, Table 6 may provide one of the specific example for Φ={1, 3, 5} with the probability mass function Pr{1}=0.4, Pr{3}=0.3, Pr{5}-0.3, Kd=4 and Na=5.

TABLE 6

The source coding related encoding with a single PMF as parameters using the round(·) operation for Kd = 4 and Na = 5.

| PMF for the amplitude set Φ = {1, 3, 5} | number of appearances of each amplitude | the first bit sequence u = [u$_0$, u$_1$, u$_2$, u$_3$] | The first amplitude sequence A = [A$_0$, A$_1$, A$_2$, A$_3$, A$_4$] |
|---|---|---|---|
| Pr{1} = 0.4, | Num(1) = 2, | 0000 | 11335 |
| Pr{3} = 0.3, | Num(3) = 2, | 0001 | 11353 |
| Pr{5} = 0.3. | Num(5) = 1. | 0010 | 13135 |
| | | 0011 | 13315 |
| | | 0100 | 13513 |
| | | 0101 | 15133 |
| | | 0110 | 15331 |
| | | 0111 | 31153 |
| | | 1000 | 31351 |
| | | 1001 | 31513 |
| | | 1010 | 33115 |
| | | 1011 | 33511 |
| | | 1100 | 35131 |
| | | 1101 | 51133 |
| | | 1110 | 51331 |
| | | 1111 | 53131 |

One of the specific implementations for the probability related parameter may be Qa probability mass functions for the set {0, 1}, where Qa is the length of the labeling of the amplitude set Φ. Denote the Qa PMFs as PMF0, PMF1, . . . , PMFQa-1. One of the specific implementations for using the Qa PMFs may include dividing the first bit sequence u into Qa parts u0, u1, . . . , uQa-1, regarding the set {0, 1} as an amplitude set and using PMFi to encode ui into a bit sequence yi of Na bits as the examples in (i), taking the i-th bit from each of the bit sequences y0, y1, . . . , and yQa-1 to form a label (y0,i, y1,i, . . . , yQa-1,i) and map to the amplitude Ai of the first amplitude sequence A, where i=0, 1, 2, . . . , Na−1. Using the round(.) operation, Table 7 may provide one of the specific example for Φ={1, 3, 5, 7} using the labeling 3 in Table 5 (b), where other parameters may include Qa=2, Kd=4, Na=5, the PMF0 is Pr{0}=0.35, Pr{1}=0.65; The PMF1 is Pr{0}=0.2, Pr{1}=0.8, the first bit sequence u=[u0, u1, u2, u3] is divided into Qa=2 parts with u0=[u0, u1, u2] of length 3 bits and u1=[u3] of length 1 bit.

for u0, Num(0)=round(5×0.35)=2, Num(1)=round(5×0.35+5×0.65)−2=3, and for u1, Num(0)=round(5×0.20)=1, Num(1)=round(5×0.20+5×0.80)−1=4.

TABLE 7

The source coding related encoding with two PMFs Pr{0} = 0.35, Pr{1} = 0.65 for y0 and Pr{0} = 0.2, Pr{1} = 0.8 for y1 for the set {0, 1} as parameters. Kd = 4, Na = 5. Num(0) = 2, Num(1) = 3 for y0; Num(0) = 1, Num(1) = 4 for y1. The labeling of the amplitude set $\Phi = \{1, 3, 5, 7\}$ is $\{11, 10, 01, 00\}$.

| the first bit sequence $u = [u_0, u_1, u_2, u_3]$ $\begin{pmatrix} u_0 \\ u_1 \end{pmatrix} = \begin{pmatrix} u_0, u_1, u_2 \\ u_3 \end{pmatrix}$ | sequences $\begin{pmatrix} y_0 \\ y_1 \end{pmatrix} = \begin{pmatrix} y_{0,0}, y_{0,1}, y_{0,2}, y_{0,3}, y_{0,4} \\ y_{1,0}, y_{1,1}, y_{1,2}, y_{1,3}, y_{1,4} \end{pmatrix}$ | the first amplitude sequence $A = [A_0, A_1, A_2, A_3, A_4]$ |
|---|---|---|
| $\begin{pmatrix} 000 \\ 0 \end{pmatrix}$ | 00111; 11110 | 55113 |
| $\begin{pmatrix} 000 \\ 1 \end{pmatrix}$ | 00111; 11011 | 55311 |
| $\begin{pmatrix} 001 \\ 0 \end{pmatrix}$ | 01011; 11110 | 51513 |
| $\begin{pmatrix} 001 \\ 1 \end{pmatrix}$ | 01011; 11011 | 51711 |
| $\begin{pmatrix} 010 \\ 0 \end{pmatrix}$ | 01101; 11110 | 51153 |
| $\begin{pmatrix} 010 \\ 1 \end{pmatrix}$ | 01101; 11011 | 51351 |
| $\begin{pmatrix} 011 \\ 0 \end{pmatrix}$ | 01110; 11110 | 51117 |
| $\begin{pmatrix} 011 \\ 1 \end{pmatrix}$ | 01110; 11011 | 51315 |
| $\begin{pmatrix} 100 \\ 0 \end{pmatrix}$ | 10101; 11110 | 15153 |
| $\begin{pmatrix} 100 \\ 1 \end{pmatrix}$ | 10101; 11011 | 15351 |
| $\begin{pmatrix} 101 \\ 1 \end{pmatrix}$ | 10110; 11110 | 15117 |
| $\begin{pmatrix} 101 \\ 1 \end{pmatrix}$ | 10110; 11011 | 15315 |
| $\begin{pmatrix} 110 \\ 0 \end{pmatrix}$ | 11001; 11110 | 11553 |
| $\begin{pmatrix} 110 \\ 1 \end{pmatrix}$ | 11001; 11011 | 11751 |
| $\begin{pmatrix} 111 \\ 0 \end{pmatrix}$ | 11010; 11110 | 11517 |
| $\begin{pmatrix} 111 \\ 1 \end{pmatrix}$ | 11010; 11011 | 11715 |

One of the specific implementations for the probability related parameter may be a non-negative integer set with a one-to-one mapping to the amplitude set and the sum of the elements in the non-negative integer set is equal to the length of the first amplitude sequence A. One of the specific implementations is that the non-negative integer set has elements being the number of each amplitude φi appearing in the first amplitude sequence A. The encoding may be the same as (i).

One of the specific implementations for the probability related parameter may be R positive integer sets with R>1. One of the specific implementations may be that the R positive integer sets are the number of 0's and 1's in each yi of (ii), where R equals to the length of the labeling of the amplitude set Qa and the encoding is the same as (ii). One of the specific implementations may be that each of R positive integer sets is the set in (iii). The encoding may be as follows.

In some embodiments, construct a one-to-one mapping between a prefix-free code of R codewords and the R positive integer sets. One of the specific implementations is R=3 and the prefix-free code may be {0, 10, 11} and the R positive integer sets are {3, 2}, {4, 1} and {1, 4} for the amplitude set {1, 3} with one-to-one mapping 0→{3, 2}; 10→{4, 1}; 11→{1, 4}.

Select the positive integer set that corresponding to the prefix bits of the first bit sequence u and encode as (iii). For example, u=[0, 0, 1, 1], the prefix bit 0 is a codeword of the prefix-free code and the corresponding positive integer set {2, 3} is used as the parameter for the encoding in (iii). Another example is u=[1, 0, 1, 1], the prefix bits 10 is a codeword of the prefix-free code the corresponding positive integer set {2, 3} is used as the parameter for the encoding in (iii). Table 8 gives the details for the encoding.

TABLE 8

The source coding related encoding with multiple positive integer sets as parameter for Kd = 4 and Na = 5 for the amplitude set Φ = {1, 3}

| Positive integer set, i.e., number of appearances of each amplitude | the first bit sequence u = [u$_0$, u$_1$, u$_2$, u$_3$], the bold bit(s) is used for selecting the positive integer set | The first amplitude sequence A = [A$_0$, A$_1$, A$_2$, A$_3$, A$_4$] |
|---|---|---|
| {3, 2} with Num(1) = 3, Num(3) = 2. | 0000 | 11133 |
| | 0001 | 11313 |
| | 0010 | 11331 |
| | 0011 | 13113 |
| | 0100 | 13311 |
| | 0101 | 31113 |
| | 0110 | 31131 |
| | 0111 | 31311 |
| {4, 1} with Num(1) = 4, Num(3) = 1. | 1000 | 11113 |
| | 1001 | 11131 |
| | 1010 | 11311 |
| | 1011 | 13111 |
| {1, 4} with Num(1) = 1, Num(3) = 4. | 1100 | 13333 |
| | 1101 | 31333 |
| | 1110 | 33133 |
| | 1111 | 33313 |

Further, in a specific example of this embodiment, the energy threshold encoding can encode the first bit sequence u into the first amplitude sequence A according to a pre-defined value $E_m > 0$ such that the sequence energy of any of the $2^{Kd}$ possible output of the energy threshold encoding is less than or equal to $E_m$. One of the specific implementations may be discussed as follows.

The sequence energy may be defined as the square sum of the amplitudes in the first amplitude sequence as example.

Among all the $Ma^{Na}$ amplitude sequences of length Na for the amplitude set Φ, denote $T_i(a_0, a_1, \ldots, a_i)$ as the number of amplitude sequences with the first i amplitudes being $a_0$, $a_1, \ldots, a_i$ and the sequence energy less than or equal to $E_m$. Take the pre-defined value $E_{max}=28$, the amplitude set Φ={1, 3, 5}, Na=4 as an example. Then, $T_3(1, 3, 3, 3)=1$ since [1, 3, 3, 3] itself has an energy less than or equal to 28, $T_2(1, 3, 5)=0$ since $1^2+3^2+5^2=35>28$, $T_2(1, 3, 3)=2$ since both [1, 3, 3, 1] and [1, 3, 3, 3] have energy not greater than 28.

Take Kd=4 as an example. The encoding from the first bit sequence u=[u$_0$, u$_1$, u$_2$, u$_3$] to the first amplitude sequence A=[A$_0$, A$_1$, A$_2$, A$_3$] is in Algorithm 1.

Algorithm 1 may include ne of the specific implementation of the energy threshold encoding by converting u into an integer and set I0=I. For i=0, 1, 2, 3 Find Ai in the amplitude set Φ={1, 3, 5} such that $$\sum_{a<A_j} T_i(A_0, A_1, A_{i-1}, a) \le I_i < \sum_{a \le A_j} T_i(A_0, A_1, A_{j-1}, a)$$

and if i<Na−1, compute $$I_{i+1} = I_i - \sum_{a<A_i} T_i(A_0, A_1, A_{i-1}, a).$$

The output [A0, A1, A2, A3] may be the first amplitude sequence A.

Further, in a specific example of this embodiment, the minimum energy encoding may encode the first bit sequence u into the first amplitude sequence A such that the $2^{Kd}$ possible output of the minimum energy encoding is the $2^{Kd}$ amplitude sequences with the lowest sequence energy among all the $Ma^{Na}$ amplitude sequences with each amplitude chosen from the amplitude set. Table 9 may provide one of the specific implementation of the minimum energy encoding is that converting the first bit sequence u into an integer $$I = \sum_{i=0}^{Kd-1} u_i \cdot 2^i$$

such that the I-th minimum energy sequence is the first amplitude sequence A for the amplitude set Φ={1, 3}, Kd=3, Na=4.

TABLE 9

One of the specific implementation of the minimum energy encoding for Kd = 3 and Na = 4 for the amplitude set Φ = {1, 3}

| the first bit sequence u = [u$_0$, u$_1$, u$_2$, u$_3$] | The first amplitude sequence A = [A$_0$, A$_1$, A$_2$, A$_3$, A$_4$] |
|---|---|
| 000 | 1111 |
| 100 | 1113 |
| 010 | 1131 |
| 110 | 1311 |
| 001 | 3111 |
| 101 | 1133 |
| 011 | 1313 |
| 111 | 1331 |

Further, in a specific example of this embodiment, the variable-length encoding is one of the following: a variable-to-variable-length encoding, and a fix-to-variable-length encoding, where a variable-to-variable-length encodes the first bit sequence into the first amplitude sequence using a one-to-one mapping between a first prefix-free code and a second prefix-free code; a fix-to-variable-length encoding encodes the first bit sequence into the first amplitude sequence using a one-to-one mapping between a first fix-length bit sequence set and a second prefix-free code. A prefix-free code has the following two properties: (i) codewords have different lengths; (ii) any codeword is not the prefix of any other codewords such that if [a0, a1, ..., an−1] is a codeword of length n, there is no any other codewords of the form [a0, a1, ..., an−1, b0, b1, ..., bm−1] with m>0. The first prefix-free code is with bits as elements in a codeword. The second prefix-free code is with amplitudes as elements in a codeword. One of the specific example of the first prefix-free code is {0, 10, 110, 111} with elements in codewords being bits. One of the specific example of the second prefix-free code is {1111, 1113, 33, 53} with elements in codewords chosen from the amplitude set Φ={1, 3, 5}.

One of the specific example of the variable-to-variable-length encoding is the one-to-one mapping between the prefix-free code {0, 10, 110, 111} and the prefix-free code {1111, 1113, 33, 53} as follows: 0→1111, 10→1113, 110→33, 111→53

Table 10 may give one of the specific example of the variable-to-variable-length encoding for the amplitude set $\Phi=\{1, 3\}$. One of the specific example of the fix-to-variable-length is the one-to-one mapping between the first fix-length bit sequence set {11, 10, 01} and the prefix-free code {1111, 1113, 33} as follows: 11←1111, 10→1113, 01→33.

One of the specific example of the fix-to-variable-length is the one-to-one mapping between the prefix-free code {11, 10, 01, 00} and the prefix-free code {1111, 1113, 33, 53} as follows: 11←1111, 10→1113, 01→33, 00→53

TABLE 10

One of the specific example of the variable-to-variable-length encoding for the amplitude set $\Phi = \{1, 3\}$

| the first prefix-free code | the second prefix-free code |
| --- | --- |
| 0 | 111111 |
| 100 | 113 |
| 1010 | 111113 |
| 1011 | 11113 |
| 1100 | 1113 |
| 1101 | 1311 |
| 1110 | 3111 |
| 111100 | 133 |
| 111101 | 3113 |
| 1111100 | 1313 |
| 1111101 | 3131 |
| 1111110 | 3311 |
| 11111110 | 3133 |
| 111111110 | 3313 |
| 111111111 | 3331 |

Further, in a specific example of this embodiment, the non-linear coding encodes the first bit sequence into the first amplitude sequence such that there exist at least three different bit . . . sequences [u0,0, u0,1, . . . , u0,Kd−1], [u1,0, u1,1, . . . , u1,Kd−1], and [u2,0, u2,1, . . . , u2,Kd−1] and their corresponding output of the non-linear coding [A0,0, A0,1, . . . , A0,Na−1], [A1,0, A1,1, . . . , A1,Na−1], and [A2,0, A2,1, . . . , A2,Na−1] fulfilling all the following properties: u2,i=u1,i+u0,i mod 2 for i=0, 1, 2, . . . , Kd−1, where mod 2 is the modulo-2 operation, there exists at least an integer i such that A2,i' A1,i+A0,i mod 2, where mod 2 is the modulo-2 operation, and there exists at least an integer i such that A2,i' A1,i+A0,i, where the addition is real addition.

Further, in a specific example of this embodiment, the precoding is a non-linear coding such that there exist at least three different first bit sequences [u0,0, u0,1, . . . , u0,Kd−1], [u1,0, u1,1, . . . , u1,Kd−1], and [u2,0, u2,1, . . . , u2,Kd−1] and their corresponding second bit sequences are [v0,0, v0,1, . . . , v0,Nv−1], [v1,0, v1,1, . . . , v1,Nv−1], and [v2,0, v2,1, . . . , v2,Nv−1], respectively fulfilling all the following properties: u2,i=u1,i, +u0,i mod 2 for i=0, 1, 2, . . . , Kd−1, where mod 2 is the modulo-2 operation, and there exists at least an integer i such that v2,i' v1,i+v0,i mod 2, where mod 2 is the modulo-2 operation.

Further, in a specific example of this embodiment, the first bit sequence u can be divided into Cp sub-sequences with each sub-sequence performing the precoding separately.

The labeling of the amplitude set can have effect on the error correction performance of channel coding and modulation. If the input of the channel coding has more bit 1's, the output of the channel coding will have more bit 1's and have a better error correction performance. Thus, an amplitude appears more frequently in the output of the precoding should have a label with more bit "1", i.e., a labeling with the following property: the label of the smallest amplitude in the amplitude set Φ has bit "1" more than the label of the largest amplitude in the amplitude set Φ.

Figure 1C:
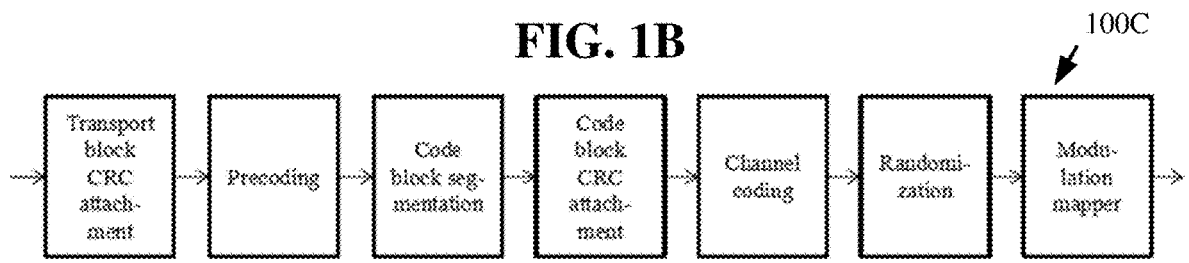
Figure 1D:
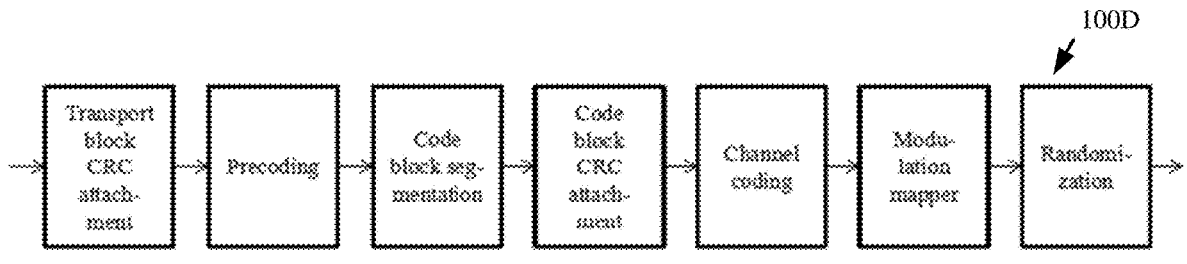
Figure 1E:
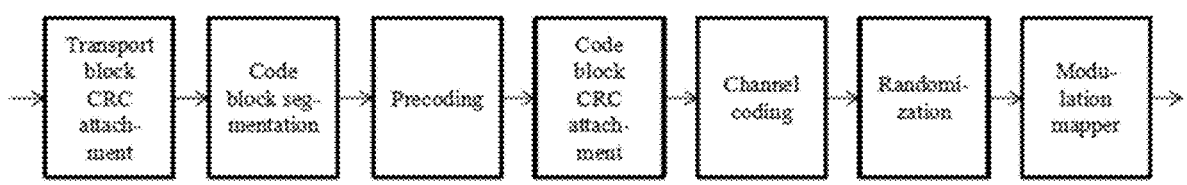
Figure 1F:
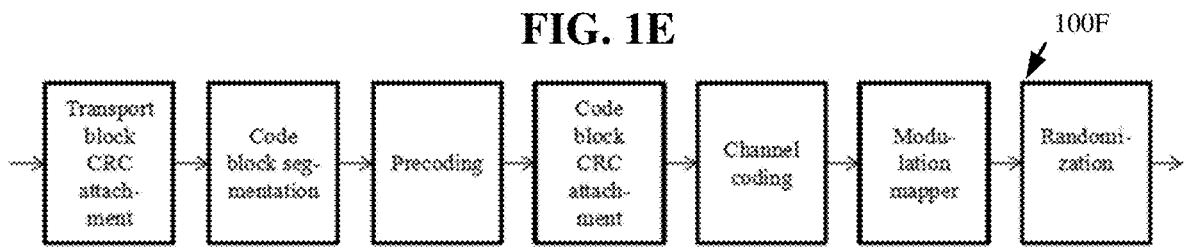
Figure 1G:
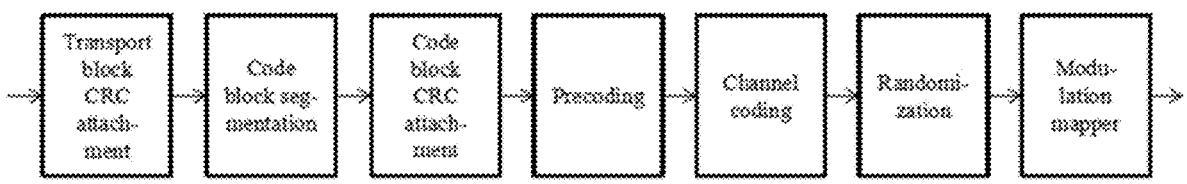

Introduction on the Possible Location of the Precoding Operation in the Radio Link The precoding operation can be located before the TB CRC attachment as shown in FIGS. 1(a) and (b), or between the TB CRC attachment and the CB CRC attachment as shown in FIGS. 1(c), (d), (e) and (f), or after the CB CRC attachment as shown in FIGS. 1(g) and (h).

FIGS. 1A-H illustrate examples 100a-h for the precoding between a transport block CRC attachment and a code block CRC attachment.

For the case that the precoding is between the transport block CRC attachment and the code block CRC attachment, FIG. 1(c) and FIG. 1(d) may provide two of the specific example that at least one portion of the output of the transport block CRC attachment is the input of the precoding, and both the output of the precoding and the output of the transport block CRC attachment excluding the at least one portion of the output of the transport block CRC attachment are the input of the code block segmentation, and the output of the code block segmentation is the input of the code block CRC attachment. the output of the code block CRC attachment is the input of the channel coding.

FIG. 1(e) and FIG. 2(f) may provide two of the specific example that the output of the transport block CRC attachment is the input of the code block segmentation, and at least one portion of the output of the code block segmentation is the input of the precoding, and both the output of the precoding and the output of the code block segmentation excluding the at least one portion of the output of the code block segmentation are the input of the code block CRC attachment.

The output of the code block CRC attachment may be the input of the channel coding. One of the benefit of the precoding between the transport block CRC attachment and the code block CRC attachment is that if errors are detected by the CRC attached to the code blocks, the decoding of the precoding is not needed which reduces receive complexity. Another benefit of the precoding between the transport block CRC attachment and the code block CRC attachment is that the TBS is larger than that of the precoding after both the transport block CRC attachment and the code block CRC attachment for a given number of resource elements.

Introduction on the Relation of the Code Rate for Different Modules in the Radio Link According to the above examples for the radio link model combining the operations of the specific coding (namely, precoding) and channel coding, the radio link model can include one or more of the following modules: 1) the bit splitting module; 2) the specific coding module; 3) channel coding module; 4) modulation module. The total number of data bits may be regarded as Ki. The bit splitting module can divide its input bits into two parts: Ks and Kc. Ks may be regarded as at least a part of the number of input bits of the specific coding module. Kc may be regarded as at least a part of the number of input bits of the channel coding module. Denote the number of the output bits of the specific coding module as Ns. Denote the Ns and Kc as at least a part of the number of the input bits of the channel coding module. The number of the output redundancy parity bits of the channel coding module may be regarded as Np. The modulation module can transform the input bits into the modulation symbols by mapping each $Q_m$ binary-bits into a complex number. Denote the number of the output modulation symbols as Nx. The marks including Ki, Ks, Kc, Ns and Np can represent not only the number of bits but also the bits sequence, and the mark Nx represents not only the number of symbols but also the modulated symbol sequence.

In the following, $Q_m=2*m$ may represent that each modulated symbol is mapped by 2*m bits which are a part of the output of the systematic coding module. $Q_m=2$ represents the quadrature phase shift keying (QPSK) modulation scheme. $Q_m=4$ represents the 16QAM. $Q_m=6$ represents the 64QAM. $Q_m=8$ represents the 256QAM.

Without considering the CRC bits attachment, the relation among the code rates for different operations may be derived according to the radio link model as shown in FIG. 1. Wherein the precoding represents the specific coding operation. If the output bits of the precoding operation are totally mapped as the amplitude of a modulation symbol, and the output bits other than the bits Ns may be totally mapped as the symbol bit of a modulation symbol. Therefore, the relationship among the number of modulated symbol Nx, the number of output redundancy parity bits of channel encoding Np, the number of input channel encoding bits Ns and Kc, and the modulation order $Q_m$ may be derived as the following:

$$Nx = \frac{Ns}{2(m-1)} = \frac{Kc + Np}{2}$$

Figure 2:
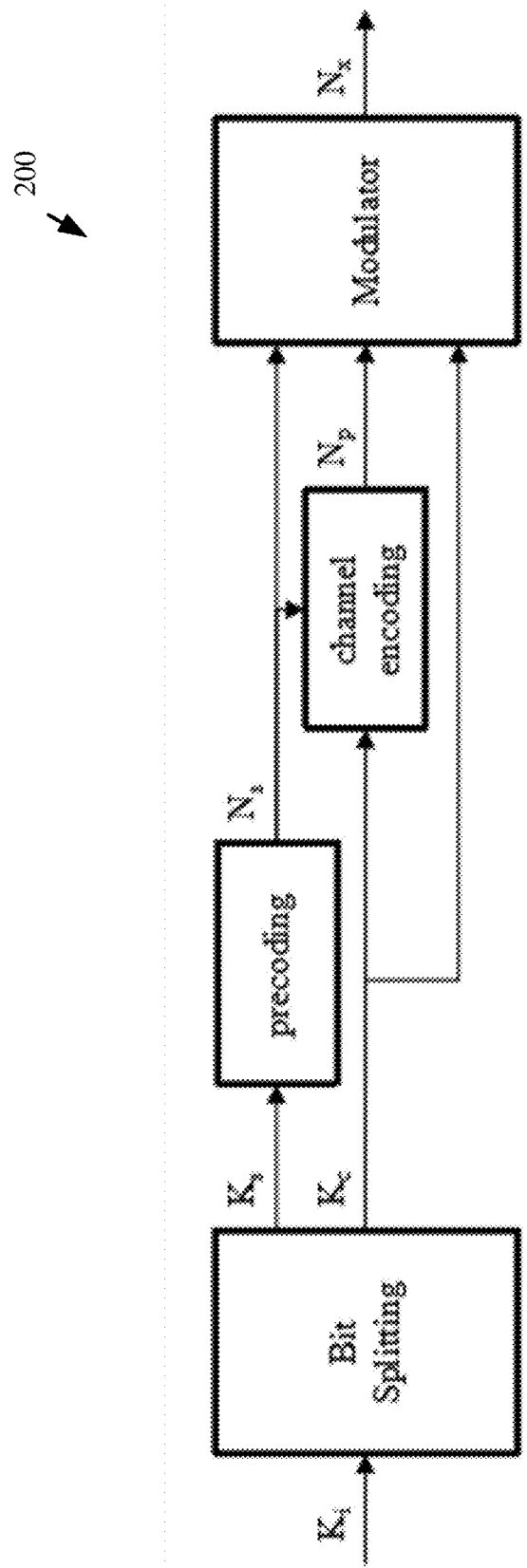
FIG. 2 illustrates an example block diagram on a radio link model combining the operations of channel coding and a specific coding.

FIG. 2 illustrates an example block diagram 200 on a radio link model combining the operations of channel coding and a specific coding.

In 3GPP 5G, for TBS determination, the intermediate information bits may be obtained by the product of the target code rate R and the associated resource parameters. The target code rate R may be also used to determine the TBS for CQI report, the target SE, base graph selection and the LDPC coding. But for the radio link in FIG. 2, if the L1 signaling only indicates the code rate of channel coding Rc and the code rate of precoding operation Rs, then the code rate used to determine the number of intermediate information bits for TBS determination may be derived as the effective code rate ($R_{eff}$) based on the indicated two code rates for the precoding and channel coding module.

For example, if the target code rate of precoding operation is indicated as Rs and the target code rate of channel coding operation is indicated as Rc, wherein the indicated Rs represents the value of Ks/Ns, and the indicated Rc represents the value of (Ns+Kc)/(Ns+Kc+Np), the code rate $R_{eff}$ used to determine the number of intermediate information bits can be derived as following . . .

$$R_{eff} = \frac{Ks + Kc}{Ns + Kc + Np}$$
$$= \frac{Ns \times Rs + (2 \times m \times Nx \times Rc - Ns)}{2 \times (m-1) \times Nx + 2 \times Nx}$$
$$= \frac{2 \times (m-1) \times Nx \times (Rs - 1) + 2 \times m \times Nx \times Rc}{2 \times m \times Nx}$$
$$= (Rs - 1) \times \frac{m-1}{m} + Rc$$

Then, the relationship between Ks and Kc can be derived as following $$Rc = \frac{Ns + Kc}{Ns + Kc + Np}$$
$$= \frac{Ns + Kc}{Ns + \frac{Ns}{m-1}}$$
$$= \left(1 + \frac{Kc}{Ns}\right) \times \left(1 - \frac{1}{m}\right)$$
$$= \left(1 + \frac{Kc}{Ks} \times Rs\right) \times \left(1 - \frac{1}{m}\right)$$
$$\Rightarrow \frac{Kc}{Ks} = \frac{Rc \times \frac{m}{m-1} - 1}{Rs}.$$

So the spectrum efficiency (SE) according to the effective code rate can be derived as following: $SE_{eff}=R_{eff} \times Q_m=2(m-1) \times (Rs-1)+2m \times Rc$.

The ratio of the number of two parts of split bits, Kc and Ks respectively, for the bit splitting module may be not smaller than 0.

There is the same method to derive the code rate Rc if the code rate Rs and the code rate $R_{eff}$ are determined by the MCS index indicated by L1 signaling. And the method to derive the code rate $R_{eff}$ for TBS determination may be the same.

System Overview

In the following, the layer 1 (L1) signaling can represent the physical layer signaling or a PDCCH carrying the DCI. The higher layer parameter can represent the radio resource control (RRC) signaling or the medium access control (MAC) signaling or MAC entity. The high-layer parameter represents the RRC signaling or a RRC information element (IE).

In the following, CBS can be the number of bits of the code block used for channel encoding. For example, for NR LDPC, the maximum code block size for LDPC base graph 1 is 8448, and the maximum code block size for LDPC base graph 2 is 3840.

The parameters related to the specific coding operation or precoding module can include at least one of the following: 1) code rate (Rs); 2) input bits (Ks); 3) coded bits (Ns). The parameters related to the channel coding module can include at least one of the followings: 1) code rate (Rc); 2) input bits (Kc); 3) selected base graph or matrix for channel coding; 4) the number of code blocks.

The target code rate Rt can represent the code rate directly used to determine the $N_{info}$ for TBS determination indicated by L1 signaling.

The effective code rate ($R_{eff}$) can represent the code rate derived by the code rate Rs and Rc or represents the number of information bits (including TBS) divided by the number of physical channel bits on PDSCH or PUSCH.

In some embodiments, the number of information bits includes the transport block size and the number of transport block cyclic redundancy check (TB-CRC) bits.

In some embodiments, the effective code rate of the specific coding module Rs_eff or LDPC coding module Rc_eff can be defined as the number of input bits including the CRC bits divided by the number of output bits which are available for transmission in the physical channel resource on PDSCH or PUSCH.

In some embodiments, the effective code rate ($R_{eff}$) can be similar to the target code rate (Rt).

In some embodiments, the target code rate (Rt) can be determined by the MCS index ($I_{MCS}$) by the UE, wherein the MCS index indicated by the DCI.

The present embodiments can include the combination of code rate and modulation order selection for CQI report, BG selection, TBS determination and MCS indication, and the specific TBS determination procedure for the radio link combining the operations of the specific coding and channel coding.

The parameters related to the CQI report can include the resource for channel measurement, the CQI table configured by the higher layer parameter and the CQI index used to determine the combination of modulation scheme and transport block size.

The parameters related to the BG selection can include the number of input bits for the LDPC coding, the code rate, the candidate base graphs.

The parameters related to the TBS determine can include the modulation order $Q_m$, the total number of configured resource elements (REs), the effective code rate $R_{eff}$ or the target code rate Rt and the number of layer.

In some embodiments, for the radio link combining the operations of the specific coding and channel coding, any two of the three parameters of Rs, Rc and Rt or $R_{eff}$ can used to determine the remaining one.

Embodiment 1: CQI Report

In some embodiments, the UE derives CQI value reported in the uplink slot based on the combination of modulation order, target code rate and transport block size corresponding to the CQI index.

In some embodiments, the target code rate is the code rate used for TBS determination corresponding to the CQI index.

In some embodiments, the target code rate is the code rate used for the specific coding operation corresponding to the CQI index.

In some embodiments, the target code rate is the code rate used for the channel coding operation corresponding to the CQI index.

In some embodiments, the target code rate is the effective code rate derived by the code rate for the specific coding and channel coding operation corresponding to the CQI index.

In some embodiments, the TBS determination procedure for CQI report accords to the procedure described in Embodiments 3 and 4.

Embodiment 2: BG Selection for LDPC Coding

The BG selection or matrix generation for channel coding can be related to the code rate Rc and the number of input bits. When the specific coding operation is performed before the channel coding operation as shown in FIG. 1, the code rate Rc can related to or determined by at least one of the following parameters: the MCS index indicated by L1 signaling; the code rate Rs for the specific coding operation; the number of input bits for the specific coding operation; the modulation order; the transport block size.

In FIG. 1(c~f), the BG selection can be also related to the number of CRC bits for a TB.

In FIG. 1(g~h), the BG selection can also be related to the code block size and the number of CRC bits for a CB. Wherein the code block can be used for channel coding and/or the specific coding operation.

When the LDPC coding operation is performed before or after the specific coding operation, the BG selection can be related to at least one of the following parameters: the transport block size; the rate Rs for the specific coding operation; the modulation order.

The number of input bits is related to at least one of the following parameters: the transport block size; the rate Rs for specific coding operation; the modulation order; and the code rate Rc for LDPC coding.

A first method can relate to a two BGs for radio link model. In some embodiments, when there are two BGs used for LDPC coding, if the number of input bits for LDPC coding (Kc) is not larger than T1, or if Kc is not larger than T2 and the code rate Rc is not larger than R1, or the code rate Rc is not larger than R2, LDPC base graph 2 is used; otherwise, LDPC base graph 1 is used.

In some embodiments, the value of R1 is not smaller than ⅔, the value of R2 is not smaller than ¼, the value of T1 is not smaller than 292, and the value of T2 is not smaller than 3824.

In some embodiments, when there are two BGs used for LDPC coding, if the number of input bits for the specific coding (Ks) is not larger than T1, or if Ks is not larger than T2 and the code rate Rs is not larger than R1, or the code rate Rs is not larger than R2, LDPC base graph 2 is used; otherwise, LDPC base graph 1 is used.

In some embodiments, the value of R1 is not larger than ⅔, the value of R2 is not larger than ¼, the value of T1 is not larger than 292, and the value of T2 is not larger than 3824.

In some embodiments, when there are two BGs used for LDPC coding, if the number of input bits for the specific coding (Ks) is not larger than T1, or if Ks is not larger than T2 and the code rate Rc is not larger than R1, or the code rate Rc is not larger than R2, LDPC base graph 2 is used; otherwise, LDPC base graph 1 is used.

In some embodiments, the value of R1 is not smaller than ⅔, the value of R2 is not smaller than ¼, the value of T1 is not larger than 292, and the value of T2 is not larger than 3824.

The threshold T1 and T2 can be related to the intermediate information bits, and/or the target code rate Rt or the effective code rate $R_{eff}$, and/or the code rate Rc, and/or the rate Rs, and/or the modulation order.

The threshold R1 and R2 can be related to the code rate Rc, and/or the rate Rs, and/or the target code rate Rt or the effective code rate $R_{eff}$. The value of T1 can be smaller than that of T2 and the value of R1 is larger than that of R2.

For example, the BG selection procedure according to the radio link model in FIG. 2 is as following: Assume that Rs=⅓, Rc=⅔, and 64QAM ($Q_m$=6=2*m) determined by the MCS index indicated by a DCI, and the TBS=4736 determined by the TBS procedure in this disclosure. Then the following parameters can be obtained: the target code rate is Rt=(Rs−1)*(m−1)/m+Rc=⅖, the number of input bits for the specific coding operation is Ks=4760, the number of output bits for the specific coding operations is Ns=Ks/Rs=14280.

For LDPC coding, the following parameters can be obtained: the number of input bits for LDPC coding is Kc=Ns=14280, the cod rate for LDPC coding is Rc=⅔. Therefore, the LDPC base graph 1 can be used according to Rc≤⅔ and Kc>3824.

A second method can relate to two BGs selection for LDPC coding.

In some embodiments, for TBS determination procedure, the UE can firstly determine the unquantized number of the intermediate information bits $N_{info}$ after the UE determines the target code rate and the modulation order $Q_m$ based on the MCS index indicated by a DCI.

In some embodiments, the UE determines the TBS based on different steps based on the comparison between $N_{info}$ and the predefined threshold.

In some embodiments, the predefined threshold is related to the value of T2 and the ratio of the number of the two parts of split bits, e.g. Kc/Ks.

In some embodiments, the predefined threshold is defined as T2*(1+δ)*Rs/(Rs+8) which is to (Ks+Kc). Wherein δ represents the ratio of the number of two parts of split bits. In some embodiments, δ is a real number which is not smaller than 0.

In some embodiments, the value of δ can be determined by the code rate Rt, and/or code rate Rs, and/or the code rate Rc and/or the modulation order.

In some embodiments, the UE determines the number of code blocks based on the maximum CBS including the CRC bits and the modified $N_{info}$. Wherein the maximum CBS including CRC bits corresponds to the selected BG.

In some embodiments, the modified $N_{info}$ is not larger than T1, or if the modified $N_{info}$ is not larger than T2 and the code rate Rc is not larger than R1, or the code rate Rc is not larger than R2, LDPC base graph 2 is used; otherwise, LDPC base graph 1 is used.

In some embodiments, the modified $N_{info}$ is the value that modified $N_{info}$ by $2^n$. Wherein n is an integer and can be determined by $N_{info}$.

The threshold T1 and T2 is modified by a scaling factor based on the T2, the δ and Rs. The scaling factor is related to at least one of the following parameters: 1) the code rate Rs; 2) The target code rate Rt; 3) The modulation order; 4) The ratio δ of the two parts of information bits split by the bit splitting module.

The threshold R1 and R2 can be related to the code rate Rc, and/or the rate Rs, and/or the target code rate Rt or the effective code rate $R_{eff}$. The value of T1 can be smaller than that of T2 and the value of R1 is larger than that of R2.

In some embodiments, the value of R1 is ⅔ and the value of R2 is ¼.

A third method can relate to one BG for LDPC coding.

In some embodiments, if the TB can be encoded by the combination of channel coding and the specific coding operations, only one BG is used for channel coding.

In some embodiments, the channel coding is LDPC coding.

In some embodiments, the BG is LDPC base graph 1.

In some embodiments, there is code block segmentation operation before the specific coding operation and the BG is LDPC base graph 2.

In some embodiments, the maximum CBS for the specific coding operation is smaller than that of the LDPC coding corresponding to the selected BG.

In some embodiments, the maximum CBS for the specific coding operation is related to the code rate Rs for the specific coding operation.

Embodiment 3: TBS Determination for the Radio Link with the Specific Coding and Channel Coding In some embodiments, the TBS determined by the TBS determination procedure should be satisfied with the constraint conditions on the input bits for the specific coding operation and the channel coding operation.

In some embodiments, the TBS can be evenly split by the bit splitting module.

In some embodiments, the value of the product of the TBS and the ratio δ of the bit splitting module should be an integer.

In some embodiments, the constraint conditions on the input bits of the specific coding operation include at least one of the following: 1) the effective code rate of the specific coding module should not be larger than a threshold1; 2) The total number of input bits of the specific coding module can be evenly divided by a divisor1; 3) The number of information bits of each code block of the specific coding module can be evenly divided by a divisor2; 4) The ratio between the information bit size of the two parts divided by the bit splitting module should be not larger than 1.

The threshold1 is smaller than ⅔, the divisor1 is equal to 8 and/or modulation order and/or the number of code block of the specific coding module or the least common multiple of 8 and the modulation order.

In some embodiments, the constraint conditions on the input bits of LDPC coding include at least one of the following: 1) The effective code rate of the LDPC coding should not be larger than 0.95; 2) The number of input bits of the LDPC coding can be evenly divided by the product of 8 and the number of code block; 3) The number of information bits of each code block of the specific coding module can be evenly divided by 8; 4) The ratio of the information bit size of the two parts divided by the bit splitting module should be not smaller than 1; 5) The code rate Rc of LDPC coding should not be smaller than $(Q_m-2)/Q_m$.

In some embodiments, for the TBS determination procedure according to the radio link model combining the channel coding and the specific coding operation, if two base graphs can be used for channel coding operation, the UE shall select the base graph according to the methods in above embodiments.

A first method for TBS determination procedure, for data transmission with the specific coding operation and channel coding operation, can include at least one of the following steps:

Step 1), the UE determines the total number of resource element ($N_{RE}$) based on the plurality of parameters indicated by a DCI or configured by a higher layer parameter.

In some embodiments, the plurality of parameters can include the allocated physical resource block (PRB), the number of subcarriers in a PRB, the allocated demodulation reference signal (DMRS) symbols, and/or the overhead of the control resource set (CORESET) or other RS in physical channel, and the number of symbol of the PDSCH or PUSCH allocation within a slot.

In some embodiments, the allocated PRB does not include the number of PRB used for rate matching indicated by DCI format 1-1 or DCI format 1-2.

Step 2), the UE can determine the temporary value Temp_v related to the TBS based on a plurality of parameters.

In some embodiments, the plurality of parameters include the total number of RE ($N_{RE}$), the modulation order ($Q_m$), the code rate (R) and the number of layers.

In some embodiments, the code rate (R) corresponds to the target code rate Rt or corresponds to the effective code rate ($R_{eff}$). Wherein the target code rate Rt can be determined by the MCS index indicated by a DCI. Wherein the effective code rate ($R_{eff}$) can be determined by the code rate (Rs) of the specific coding operation and/or the code rate (Rc) of channel coding operation, and/or the modulation order, and/or the number of CRC bits.

In some embodiments, the UE determines the temporary value Temp_v by multiplying the total number of RE ($N_{RE}$), the modulation order ($Q_m$), the code rate (Rc) for channel coding, the number of layers and a scaling factor β.

In some embodiments, the scaling factor β is a function of the modulation order ($Q_m$), and/or the code rate (Rs) for the specific coding operation, and/or the number of CRC bits.

Step 3), the temporary value Temp_v can be modified by the a modifying value α to generate the modified value Temp_m. Wherein a is the value of $2^n$. In some embodiments, n is an integer and is not smaller than 3. In some embodiments, the value of n is related to the temporary value Temp_v.

In some embodiments, when the temporary value Temp_v is not larger than a threshold, the modifying value α1 can be an integer which is equal to $2^n$, wherein n is not smaller than 3.

In some embodiments, when the temporary value Temp_v is larger than a threshold, the Temp_v is modified based on the CRC bits for the TB and the modifying value α2 to generate the modified value Temp_m, wherein the modifying value α2 can be an integer which is equal to $2^n$. Wherein n is not smaller than 6.

In some embodiments, the threshold is equal to 3824.

In some embodiments, the threshold is defined as T2*(1+δ)*Rs/(Rs+δ). Wherein δ represents the ratio of the number of two parts of split bits. In some embodiments, δ is a real number which is not smaller than 0.

Step 4), if the bit splitting operation is configured or available for the UE, the UE can determine the number of the two temporary parts of split bits including the specific coding (Ks_v) and channel coding (Kc_v) based on the ratio δ. Wherein δ represents the ratio of the number of two parts of split bits. In some embodiments, δ is a real number which is not smaller than 0.

In some embodiments, the value of δ can be determined by the code rate Rt, and/or code rate Rs, and/or the code rate Rc and/or the modulation order.

Step 5), the Kc_v can be modified to generate the modified number of information bits Kc_m for channel coding module. In some embodiments, the modified number of information bits Kc_m for channel coding is the final part of the input bits for channel coding.

Step 6), the Ks_v is modified by the rounding function or the constraint conditions of the code block segmentation for the specific coding module to generate the modified number of information bits Ks_m for the specific coding module.

In some embodiments, the modifying procedure of the Steps 2)-4) in the NR TBS procedure is reused to modify the Kc_v to generate the Kc_m in Step 5) by replacing the $N_{info}$ with Kc_v and replacing the modifying value α to the modifying value β based on the constraint conditions for the specific coding module.

In some embodiments, if the channel coding can be LDPC coding, the modifying procedure of the Steps 2)-4) in the NR TBS procedure is reused to modify the Kc_v to generate the Kc_m in Step 5) by replacing the $N_{info}$ with Kc_v.

In some embodiments, the modifying procedure of the Steps 2)-4) in the NR TBS procedure is reused to modify the Ks_v to generate the Ks_m in Step 6) by replacing the $N_{info}$ with Ks_v and replacing the modifying value α to the modifying value β based on the constraint conditions for the specific coding module.

In some embodiments, the modifying value α can represents the modifying value $2^n$ or the modifying value of the maximum CBS corresponding to the selected BG.

Step 7), the final TBS can be determined by the addition of the modified Kc_m and Ks_m. The number of information bits for the specific coding module is Ks_m, and the number of information bits for LDPC coding module is Kc_m.

An illustration for the above method 1 for TBS determination procedure for the radio link with the specific coding and LDPC coding is shown as FIG. 2.

Figure 3:
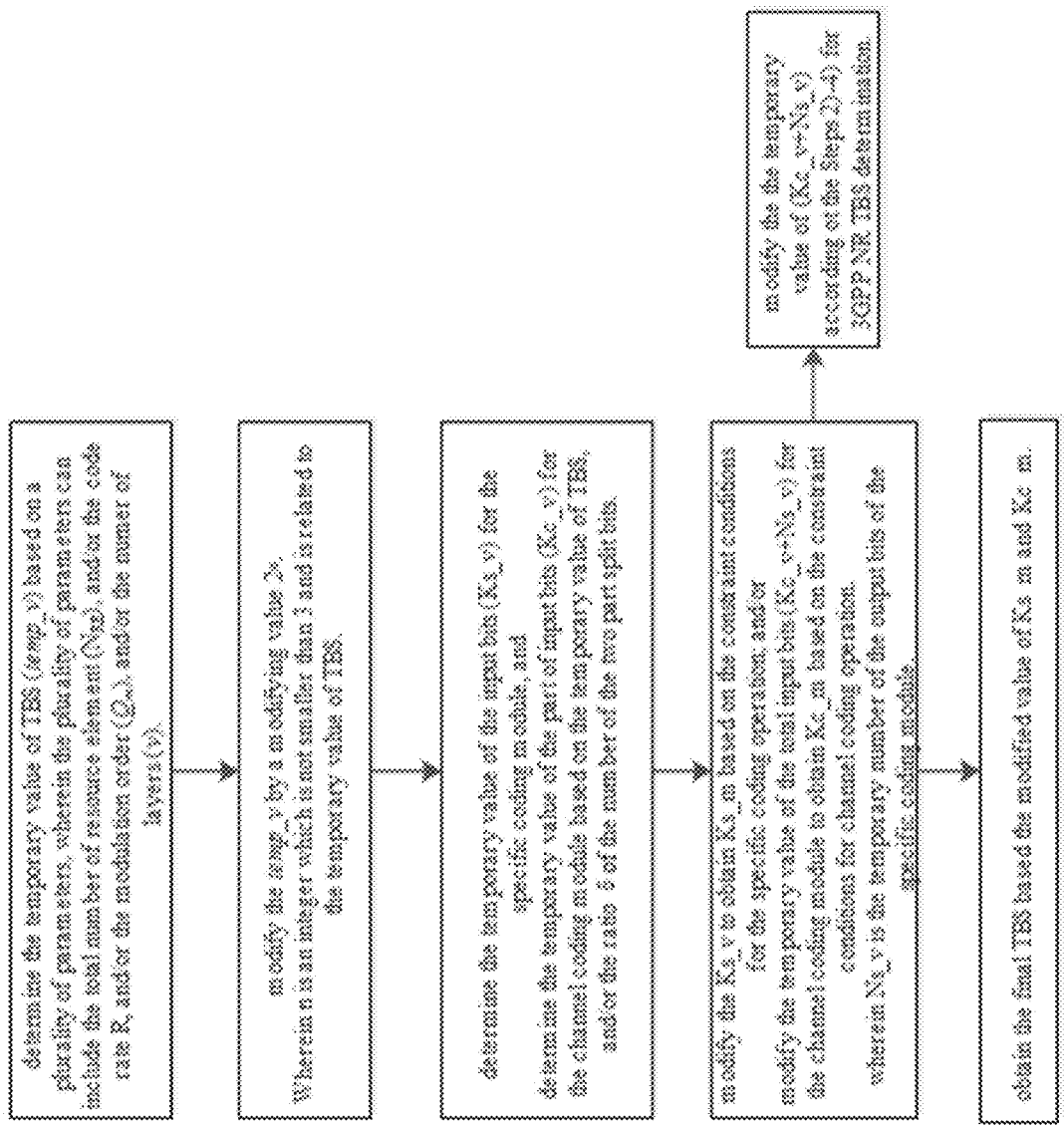
FIG. 3 is an example flow process of a TBS determination procedure for system using the specific coding and LDPC coding.

FIG. 3 is an example flow process 300 of a TBS determination procedure for system using the specific coding and LDPC coding.

A second method for TBS determination procedure, for data transmission with the specific coding operation and LDPC coding operation, can include st least one of the following steps:

Step 1), the UE can determine the total number of resource element ($N_{RE}$) based on the plurality of parameters indicated by a DCI or configured by a high-layer parameter.

In some embodiments, the plurality of parameters can include the allocated physical resource block (PRB), the number of subcarriers in a PRB, the allocated dedicated demodulation reference signal (DMRS) symbols, and/or the overhead of the control resource set (CORESET) or other RS in physical channel, and the number of symbol of the PDSCH or PUSCH allocation within a slot.

Step 2), the UE can determine the temporary value Temp_v related to the TBS based on a plurality of parameters.

In some embodiments, the plurality of parameters include the total number of RE ($N_{RE}$), the modulation order ($Q_m$), the code rate (R) and the number of layers (v).

In some embodiments, the code rate (R) corresponds to the target code rate Rt or corresponds to the effective code rate ($R_{eff}$). In some embodiments, the target code rate Rt can be determined by the MCS index indicated by a DCI. In some embodiments, the effective code rate ($R_{eff}$) can be determined by the code rate (Rs) of the specific coding operation and/or the code rate (Rc) of LDPC coding operation, and/or the modulation order, and/or the number of CRC bits.

Step 3), the temporary value Temp_v can be modified by a modifying value α to generate the modified value Temp_m. Wherein a is the value of $2^n$. In some embodiments, n is an integer and is not smaller than 3. In some embodiments, the value of n is related to the temporary value Temp_v.

In some embodiments, when the temporary value Temp_v is not larger than a threshold, the modifying value α1 can be an integer which is equal to $2^n$, wherein n is an integer and is not smaller than 3.

In some embodiments, when the temporary value Temp_v is larger than a threshold, the Temp_v is modified based on the CRC bits for the TB and the modifying value α2 to generate the modified value Temp_m. Wherein the modifying value α2 can be an integer which is equal to $2^n$. In some embodiments, n is not smaller than 6.

In some embodiments, the threshold is equal to 3824.

In some embodiments, the threshold is defined as T2*(1+δ)*Rs/(Rs+δ). Wherein δ represents the ratio of the number of two parts of split bits. In some embodiments, δ is a real number which is not smaller than 0.

Step 4), if the bit splitting operation is configured or available for the UE, the UE can determine the number of the two temporary parts of information bits including Ks_v and Kc_v based on the modified value Temp_m of the TBS, the ratio of Kc to Ks, and the rounding function. Wherein the rounding function is used to modify the number of the temporary split information . . . bits Ks_v and Kc_v into an integer.

In some embodiments, the rounding function can include the modifying function to generate the number of modified information bits Kc_m and Ks_m which are satisfied with the constraint conditions for the corresponding coding operations.

In some embodiments, the ratio is a function of the number of the two parts of information bits divided by the bit splitting module, the code rate Rc of LDPC coding, and/or the code rate Rs of the specific coding operation, and/or the modulation order, and/or the target code rate Rt or the effective code rate $R_{eff}$.

In some embodiments, the rounding function represents rounding down, or rounding up, or rounding.

In some embodiments, the addition of the Kc_m and Ks_m should be equal to the value of Temp_m.

Step 5), the final TBS can be determined by the addition of the modified Kc_m and Ks_m.

An illustration for the above method 2 for TBS determination procedure for the radio link with the specific coding and LDPC coding is shown as FIG. 3.

Figure 4:
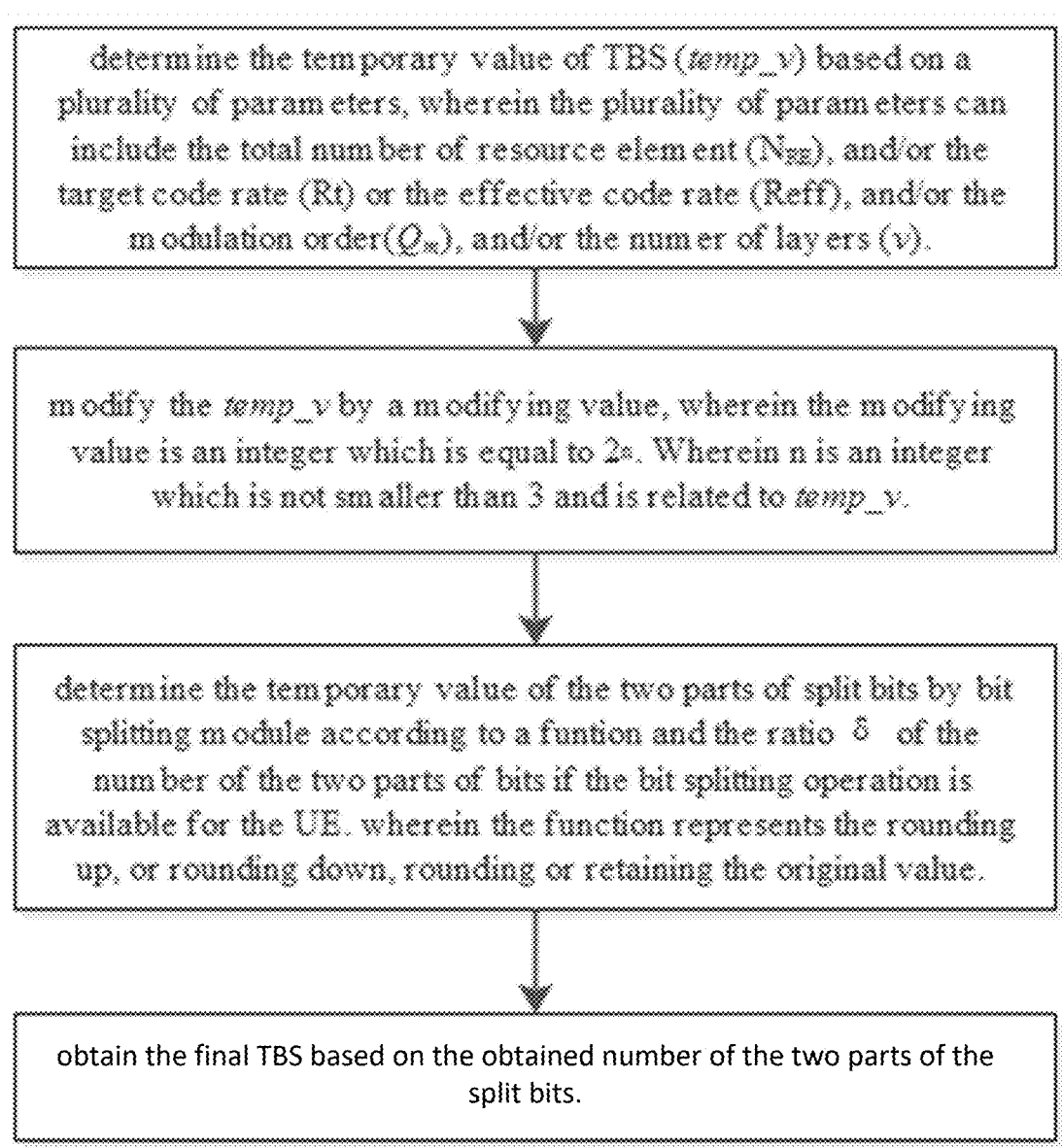
FIG. 4 is an example flow chart for a TBS determination procedure.

FIG. 4 is an example flow chart 400 for a TBS determination procedure.

A third method for TBS determination procedure, for data transmission with the specific coding operation and LDPC coding operation, can include at least one of the following steps:

Step 1), the UE can determine the total number of resource element ($N_{RE}$) based on the plurality of parameters indicated by a DCI or configured by a high-layer parameter.

In some embodiments, the plurality of parameters can include the allocated physical resource block (PRB), the number of subcarriers in a PRB, the allocated dedicated demodulation reference signal (DMRS) symbols, and/or the overhead of the control resource set (CORESET) or other RS in physical channel, and the number of symbol of the PDSCH or PUSCH allocation within a slot.

Step 2), the UE can determine the temporary value Temp_v related to the TBS based on a plurality of parameters.

In some embodiments, the plurality of parameters include the total number of RE ($N_{RE}$), the modulation order ($Q_m$), the code rate (R) and the number of layers (v).

In some embodiments, the code rate (R) corresponds to the target code rate Rt or corresponds to the effective code rate ($R_{eff}$). In some embodiments, the target code rate Rt can be determined by the MCS index indicated by a DCI. In some embodiments, the effective code rate ($R_{eff}$) can be determined by the code rate (Rs) of the specific coding operation and/or the code rate (Rc) of LDPC coding operation, and/or the modulation order, and/or the number of CRC bits.

In some embodiments, the temporary value Temp_v is obtained by the product of the total number of RE ($N_{RE}$), the modulation order (Om), the code rate (R) and the number of layers (v).

Step 3), the temporary value Temp_v can be modified by a modifying value α to generate the modified value Temp_m. Wherein a is the value of $2^n$. In some embodiments, n is an integer and is not smaller than 3. In some embodiments, the value of n is related to the temporary value Temp_v.

In some embodiments, when the temporary value Temp_v is not larger than a threshold, the modifying value α1 can be an integer which is equal to $2^n$, wherein n is an integer and is not smaller than 3.

In some embodiments, when the temporary value Temp_v is larger than a threshold, the Temp_v is modified based on the CRC bits for the TB and the modifying value α2 to generate the modified value Temp_m. Wherein the modifying value α2 can be an integer which is equal to $2^n$. In some embodiments, n is not smaller than 6.

In some embodiments, the threshold is equal to 3824.

In some embodiments, the threshold is defined as T2*(1+δ)*Rs/(Rs+δ). Wherein δ represents the ratio of the number of two parts of split bits. In some embodiments, δ is a real number which is not smaller than 0.

Step 4), the modified value Temp_m is determined as the final TBS.

A fourth method for TBS determination procedure, for data transmission with the specific coding operation and LDPC coding operation, can include at least one of the following steps:

Step 1), the UE can determine the total number of resource element ($N_{RE}$) based on the plurality of parameters indicated by a DCI or configured by a high-layer parameter.

In some embodiments, the plurality of parameters can include the allocated physical resource block (PRB), the number of subcarriers in a PRB, the allocated dedicated demodulation reference signal (DMRS) symbols, and/or the overhead of the control resource set (CORESET) or other RS in physical channel, and the number of symbol of the PDSCH or PUSCH allocation within a slot.

Step 2), the UE can determine the temporary value Temp_v related to the TBS based on a plurality of parameters.

In some embodiments, the plurality of parameters include the total number of RE ($N_{RE}$), the modulation order ($Q_m$), the code rate (R) and the number of layers (v).

In some embodiments, the code rate (R) corresponds to the target code rate Rt or corresponds to the effective code rate ($R_{eff}$). In some embodiments, the target code rate Rt can be determined by the MCS index indicated by a DCI. In some embodiments, the effective code rate ($R_{eff}$) can be determined by the code rate (Rs) of the specific coding operation and/or the code rate (Rc) of LDPC coding operation, and/or the modulation order, and/or the number of CRC bits.

In some embodiments, the temporary value Temp_v is obtained by the product of the total number of RE ($N_{RE}$), the modulation order ($Q_m$), the code rate (R) and the number of layers (v).

Step 3), the temporary value Temp_v can be modified by a modifying value α to generate the modified value Temp_m. Wherein a is the value of $2^n$. In some embodiments, n is an integer and is not smaller than 3. In some embodiments, the value of n is related to the temporary value Temp_v.

In some embodiments, when the temporary value Temp_v is not larger than a threshold, the modifying value α1 can be an integer which is equal to $2^n$, wherein n is an integer and is not smaller than 3.

In some embodiments, when the temporary value Temp_v is larger than a threshold, the Temp_v is modified based on the CRC bits for the TB and the modifying value α2 to generate the modified value Temp_m. Wherein the modifying value α2 can be an integer which is equal to $2^n$. In some embodiments, n is not smaller than 6.

In some embodiments, the threshold is equal to 3824.

In some embodiments, the threshold is defined as T2*(1+δ)*Rs/(Rs+δ). Wherein δ represents the ratio of the number of two parts of split bits. In some embodiments, δ is a real number which is not smaller than 0.

Step 4), if the Temp_v is not larger than the threshold, the final TBS is determined as a TBS in a TBS table that is not less than and closest to the modified value Temp_m, or not larger than and closest to the modified value Temp_m, or is closest to the modified value Temp_m.

Step 5), if the Temp_v is larger than the threshold, the modified value Temp_m is determined as the final TBS.

A fifth method for TBS determination procedure, for data transmission with the specific coding operation and LDPC coding operation, can include at least one of the following steps:

Step 1), the UE can determine the total number of resource element ($N_{RE}$) based on the plurality of parameters indicated by a DCI or configured by a high-layer parameter.

In some embodiments, the plurality of parameters can include the allocated physical resource block (PRB), the number of subcarriers in a PRB, the allocated dedicated demodulation reference signal (DMRS) symbols, and/or the overhead of the control resource set (CORESET) or other RS in physical channel, and the number of symbol of the PDSCH or PUSCH allocation within a slot.

Step 2), the UE can determine a first part temporary value Temp_v1 and a second part temporary value Temp_v2.

In some embodiments, the first part temporary value Temp_v1 is related to at least one of the code rate (Rs) of the specific coding operation; the total number of RE ($N_{RE}$); the modulation order ($Q_m$) and the number of layers (v).

In some embodiments, the second part temporary value Temp_v2 is related to at least one of the code rate (Rc) of the channel coding operation; the total number of RE ($N_{RE}$); the modulation order ($Q_m$) and the number of layers (v).

In some embodiments, the temporary value Temp_v1 is obtained by the product of the total number of RE ($N_{RE}$), the modulation order ($Q_m$), the code rate (Rs) of the specific coding operation and the number of layers (v).

In some embodiments, the temporary value Temp_v2 is obtained by the product of the total number of RE ($N_{RE}$), the modulation order ($Q_m$), the code rate (Rc) of the channel coding operation and the number of layers (v).

Step 3), the temporary value Temp_v1 and Temp_v2 can be modified by a modification method to generate the modified value Temp_m1 and Temp_m2 respectively. Wherein the modification method includes at least a quantization method to be satisfied with the constraint conditions for the specific coding operation and the channel coding operation respectively; a rounding operation including at least one of rounding up operation, rounding down operation and rounding operation.

In some embodiments, the temporary value Temp_v2 is modified based on the step 3) and step 4) in the TBS determination procedure in NR Rel-16 specification.

Step 4), the modified value Temp_m2 is modified by the modified value Temp_m1, and the code rate (Rs) of the specific coding based on a predefined function to generated the modified value Temp_m3.

In some embodiments, the predefined function includes at least one of the rounding operation; the addition or subtraction; the multiplying operation; the dividing operation; and the quantization operation.

Step 5), the final TBS is determined by adding the Temp_m1 and Temp_m3.

A sixth method for TBS determination procedure, for data transmission with the specific coding operation and LDPC coding operation, can include at least one of the following steps:

Step 1), the UE can determine the total number of resource element ($N_{RE}$) based on the plurality of parameters indicated by a DCI or configured by a high-layer parameter.

In some embodiments, the plurality of parameters can include the allocated physical resource block (PRB), the number of subcarriers in a PRB, the allocated dedicated demodulation reference signal (DMRS) symbols, and/or the overhead of the control resource set (CORESET) or other RS in physical channel, and the number of symbol of the PDSCH or PUSCH allocation within a slot.

Step 2), the UE can determine the temporary value Temp_v related to the TBS based on a plurality of parameters.

In some embodiments, the plurality of parameters include the total number of RE ($N_{RE}$), the modulation order ($Q_m$), the code rate (R) and the number of layers (v).

In some embodiments, the code rate (R) corresponds to the target code rate Rt or corresponds to the effective code rate ($R_{eff}$). In some embodiments, the target code rate Rt can be determined by the MCS index indicated by a DCI. In some embodiments, the effective code rate ($R_{eff}$) can be determined by the code rate (Rs) of the specific coding operation and/or the code rate (Rc) of LDPC coding operation, and/or the modulation order, and/or the number of CRC bits.

In some embodiments, the temporary value Temp_v is obtained by the product of the total number of RE ($N_{RE}$), the modulation order ($Q_m$), the code rate (R) and the number of layers (v).

Step 3), the temporary value Temp_v can be modified by a modifying value α to generate the modified value Temp_m. Wherein a is the value of $2^n$. In some embodiments, n is an integer and is not smaller than 3. In some embodiments, the value of n is related to the temporary value Temp_v.

In some embodiments, when the temporary value Temp_v is not larger than a threshold, the modifying value α1 can be an integer which is equal to $2^n$, wherein n is an integer and is not smaller than 3.

In some embodiments, when the temporary value Temp_v is larger than a threshold, the Temp_v is modified based on the CRC bits for the TB and the modifying value α2 to generate the modified value Temp_m. Wherein the modifying value α2 can be an integer which is equal to $2^n$. In some embodiments, n is not smaller than 6.

In some embodiments, the threshold is equal to 3824.

In some embodiments, the threshold is defined as T2*(1+δ)*Rs/(Rs+δ). Wherein δ represents the ratio of the number of two parts of split bits. In some embodiments, δ is a real number which is not smaller than 0.

Step 4), the modified value Temp_m1 is determined by at least one of a predefined function, the modified value Temp_m; the code rate (Rs) of the specific coding; the code rate (Rc) of the channel coding; and the ratio of the bit splitting module.

Step 5), the modified value Temp_m2 is determined by at least one of a predefined function, the modified value Temp_m; the modified value Temp_m1; the code rate (Rs) of the specific coding; the code rate (Rc) of the channel coding; and the ratio of the bit splitting module.

In some embodiments, the ratio can be determined by at least one of the code rate (Rs) of the specific coding and the code rate (Rc) of the channel coding.

In some embodiments, the predefined function includes at least one of the rounding operation; the addition or subtraction; the multiplying operation; the dividing operation; and the quantization operation.

Step 6), the final TBS is determined by adding the Temp_m1 and Temp_m2.

Each step in the above methods 1-2 for TBS determination procedure can be used as the independent embodiment.

In some embodiments, the CRC bits for a TB can be attached after the specific coding operation. For example, the radio link model in FIGS. 1(a) and (b) shows the specific coding operation (e.g. precoding operation) located before the TB CRC attachment.

In some embodiments, the CRC bits for a TB can be attached before the specific coding operation. For example, the radio link model in FIG. 1(c)-(f) shows the specific coding operation (e.g. precoding operation) located after the TB CRC attachment.

Figure 1H:
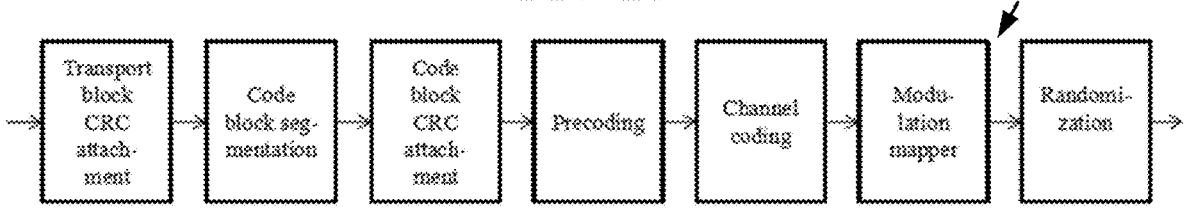

In some embodiments, the CRC bits for a TB and the CRC bits for a CB can be attached before the specific coding operation. For example, the radio link model in FIGS. 1(g) and 1(h) shows the specific coding operation (e.g. precoding operation) located after the TB CRC attachment and the CB CRC attachment.

In some embodiments, the CRC bits for a TB can be attached before at least one of the following operations: 1) Bit splitting; 2) CB segmentation corresponding to the specific coding operation; 3) CB segmentation corresponding to LDPC coding; 4) the specific coding operation; 5) LDPC coding.

In some embodiments, the CRC bits for a CB can be attached after at least one of the following operations: 1) TB CRC attachment; 2) Bit splitting; 3) CB segmentation corresponding to the specific coding operation; 4) LDPC BG selection; 5) CB segmentation corresponding to LDPC coding; 6) the specific coding operation.

The methods for TBS determination by considering the CRC attachment operation based on the radio link model in FIG. 1 are shown as followings:

For example, the CRC attachment operation is shown as the order: TB_CRC attachment←bit splitting←the specific coding segmentation and BG selection←CB segmentation.

For example, the TB CRC is attached before the specific coding operation in FIG. 4.

Figure 5:
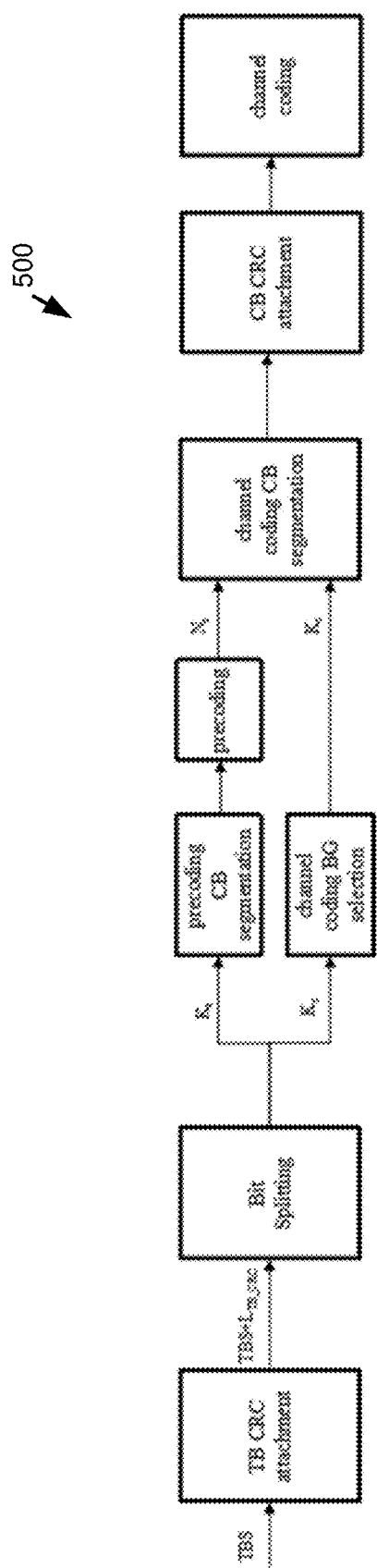
FIG. 5 is a block diagram illustrating an example CRC attachment operation.

FIG. 5 is a block diagram 500 illustrating an example CRC attachment operation. In some embodiments, if the UE detects a DCI scheduling a data transmission, the UE can 1) determine the code rate Rc, the code rate Rs and the modulation order $Q_m$ according to the configuration; 2) calculate $R_{eff}$ according to the configured Rc, Rs and $Q_m$; 3) calculate Ks, Kc: calculate TBS_temp, quantize and obtain Ks and Kc. In some embodiment, the (Ks+Kc) includes the TB_CRC bits. The UE can also 4) calculate Ns+Kc: calculate the temporary number of input bits for channel coding operation (noted as CC_temp), calculate the number of code blocks for channel coding module, and/or 5) calculate the effective code rate of Rc (noted as eff_Rc) and Rs (noted as eff_Rs).

A first example for TBS determination can assume that $n_{PRB}$=25 and the number of REs per PRB is 144, Rs=⅓, Rc=⅔, 64QAM ($Q_m$=6=2*m), and the number of layer is 1, so the total number of RES is $N_{RE}$=25*144.

Rs can represent the value of Ks/Ns, so $R_{eff}$=(Rs−1)*(m−1)/m+Rc=29/9. Assume that the number of CRC bits for code block is equal to 0 ($L_{CB\_CRC}$=0), then TBS_temp=$N_{RE}$*$R_{eff}$*$Q_m$*v=4800.

The TBS_temp can be quantized as the following: If TBS_temp>3824, n=floor (log2(TBS_temp−24))−5=7, TBS_modify=$2^n$*round((TBS_temp−24)/$2^n$)=4736, TBS=4736.

Use the Example Equation 1: Kc+Ks=4736+TB_CRC=4760 and Kc/Ks=(Rc*m/(m−1)−1)/Rs=0 to obtain Kc=0, Ks=4760.

Then, CC_temp=$N_{RE}$*Rc*$Q_m$*v=14400. The CC_temp can be quantized as the following: if Rc>¼ and CC_temp>8424, C=ceil(CC_temp/8424)=2, CC_modify=(2*8)*ceil(CC_temp/(2*8))=14400.

Use the Example Equation 2: Ns+Kc=14400. Example Equation 3: Ns=Ks/Rs. Results may include TBS=4736, Ks=4760, $L_{TB\_CRC}$=24, C=2, $L_{CB\_CRC}$=0, Kc=0, Ns=14400, eff_Rs=Ks/Ns=0.3306<Rs, eff_Rc=1/(1+1/(m−1))=⅔=Rc.

$R_{eff}$=(TBS+$L_{TB\_CRC}$)/(Ns+Ns/(m−1))=0.2204, and
Nx=Ns/(2*(m−1))=3600.

According to the same parameters of the assumption, assume that the number of CRC bits for code block is equal to 24 ($L_{CB\_CRC}$=24) attached before the specific coding operation, then CC_temp=$N_{RE}$*Rc*$Q_m$*v=14400. The CC_temp can be quantized as the following: if Rc>¼ and CC_temp>8424, C=ceil(CC_temp/8424)=2, CC_modify=(2*8)*ceil((CC_temp)/(2*8))=14400. Equation 2: Ns+Kc=14400. Equation 3: Ns=Ks/Rs. Then, TBS_temp=$N_{RE}$*$R_{eff}$*$Q_m$*v=4800. The TBS_temp can be quantized as the following: If TBS_temp>3824, n=floor (log2(TBS_temp−24−C*24))−5=7, TBS_modify=$2^n$*round ((TBS_temp−24−C*24)/$2^n$)=4736, TBS=4736.

Use Equation 1: Kc+Ks=4736+$L_{TB\_CRC}$+C*$L_{CB\_CRC}$=4808, Kc/Ks=(Rc*m/(m−1)−1)/Rs=0 to obtain Kc=0, Ks=4808.

Results: TBS=4736, Ks=4808, $L_{TB\_CRC}$=24, C=2, $L_{CB\_CRC}$=24, Kc=0, Ns=14400, eff_Rs=Ks/Ns=0.3339>Rs, eff_Rc=1/(1+1/(m−1))=⅔=Rc. $R_{eff}$=(TBS+$L_{TB\_CRC}$)/(Ns+Ns/(m−1))=0.2204, and Nx=Ns/(2*(m−1))=3600.

Assume that the number of CRC bits for code block is equal to 24 ($L_{CB\_CRC}$=24) attached between the specific coding and channel coding, then 3) CC_temp=$N_{RE}$*Rc*$Q_m$*v=14400. Quantize the CC_temp as the following: If Rc>¼ and CC_temp>8424, C=ceil (CC_temp/8424)=2, CC_modify=(2*8)*ceil((CC_temp)/(2*8))=14400

Equation 2: Ns+Kc=14400, and Equation 3: Ns=Ks/Rs.

2) TBS_temp=$N_{RE}$*$R_{eff}$*$Q_m$*v=4800. Quantize the TBS_temp as the following: If TBS_temp>3824, n=floor (log2(TBS_temp−24))−5=7, TBS_modify=$2^n$*round((TBS_temp−24)/$2^n$)=4736, TBS=4736.

Use Equation 1: Kc+Ks=4736+TB_CRC=4760, Kc/Ks=(Rc*m/(m−1)−1)/Rs=0 to obtain Kc=0, Ks=4760. The equations may not be used to obtain the Kc and Ks because the Rs may be changed to the effective Rs for the specific coding module.

Results: TBS=4736, Ks=4760, TB_CRC=24, C=2, CB_CRC=24, Kc=0, Ns=14400, eff_Rs=Ks/Ns=0.3306<Rs, eff_Rc=(Ns+Kc+C*LCB_CRC)/(Ns+Ns/(m−1))=0.6689>Rc.

$R_{eff}$=(TBS+$L_{TB\_CRC}$)/(Ns+Ns/(m−1))=0.2204, and
Nx=Ns/(2*(m−1))=3600.

Example 1-2 for TBS Determination

Assume that $n_{PRB}$=25 and the number of REs per PRB is 144, Rs=⅓, Rc=⅗, 16QAM ($Q_m$=4=2*m), and the number of layer is 1, so the total number of RES is $N_{RE}$=25*144.

1) Rs can represent the value of Ks/Ns, so $R_{eff}$=(Rs−1)*(m−1)/m+Rc=4/15. Assume that the number of CRC bits for code block is equal to 0 ($L_{CB\_CRC}$=0), then 2) TBS_temp=$N_{RE}$*Roff*$Q_m$*v=3840. Quantize the TBS_temp as the following: If TBS_temp>3824, n=floor (log2(TBS_temp−24))−5=6, TBS_modify=$2^n$*round((TBS_temp−24)/$2^n$)=3840, TBS=3840.

Kc+Ks=3840+24=3864.                                   Equation 1

Kc/Ks=(Rc*m/(m−1)−1)/Rs=⅗.⇒Kc=1439,Ks=2415.

3) CC_temp=$N_{RE}*Rc*Q_m*v$=8640. Quantize the CC_temp as the following: If Rc>¼ and CC_temp>8424, C=2, CC_modify=8640, Equation 2: Ns+Kc=8640.

$$Ns=Ks/Rs. \qquad \text{Equation 3:}$$

Temporary Results: Ks=2415, Kc=1439, Ns=7201, eff_Rs=Ks/Ns=0.3354>Rs, eff_Rc=(Ns+Kc)/(Ns+Ns/(m−1))=0.5999<Rc. $R_{eff}$=(TBS+TB_CRC)/(Ns+Ns/(m−1))=0.2683, and Nx=Ns/(2*(m−1))=3600.5.

In some embodiments, the constraint conditions for the specific coding operation should include that the Ns can be evenly divided by $(Q_m-2)$ Example 1-3 for TBS determination by considering the constraint condition for Rs.

Assume that $n_{PRB}$=25 and the number of REs per PRB is 144, Rs=⅓, Rc=⅗, 16QAM ($Q_m$=4=2*m), and the number of layer is 1, so the total number of RES is $N_{RE}$=25*144.

Rs can represent the value of Ks/Ns, so $R_{eff}$=(Rs−1)*(m−1)/m+Rc=⁴⁄₁₅. Assume that the number of CRC bits for code block is equal to 0 ($L_{CB\_CRC}$=0), then TBS_temp=$N_{RE}*R_{eff}*Q_m*v$=3840. Quantize the TBS_temp as the following: If TBS_temp>3824, n=floor(log2(TBS_temp−24))−5=6, TBS_modify=$2^n$*round((TBS_temp−24)/$2^n$)=3840, TBS=3840.

$$Kc+Ks=3840+24=3864.\ Kc/Ks=(Rc*m/(m-1)-1)/ \\ Rs=\tfrac{3}{5}.\Rightarrow Kc=1439, Ks=2415. \qquad \text{Equation 1:}$$

CC_temp=$N_{RE}*Rc*Q_m*v$=8640. Quantize the CC_temp as the following: If Rc>¼ and CC_temp>8424, C=2, CC_modify=8640, Equation 2: Ns+Kc=8640. Equation 3: Ns=Ks/Rs.

Using the equations: Kc+Ks=3864 and δ=Kc/Ks=⅗ to generate Ks_temp=2415; then, use the equations: Ns=ceil{(Ks_temp/Rs)/(2*(m−1))}*(2*(m−1))=7246 and Ns+Kc=8640 to generate Kc=1394 And Ks=2470.

The effective code rates can be obtained as the following: eff_Rs=Ks/Ns=0.3409; eff_Rc=(Ns+Kc)/(Ns+Ns/(m−1))=0.5962<Rc; and $R_{eff}$=(TBS+TB_CRC)/(Ns+Ns/(m−1))=0.2660. The number of mapped into the resource can be calculated as Nx=Ns/(2*(m−1))=3623>$N_{RE}$.

From the example 1-3, the number of modulated symbols is larger than the allocated total number of REs by the DCI.

In some embodiments, the constraint condition can include that the value of Ns/($Q_m$−2) should not be larger than the allocated total number of REs.

In some embodiments, the value of Nx is determined by the Ns/($Q_m$−2).

In some embodiments, the value of Ns should determined by the minimum value between the value of function (Ns/($Q_m$−2))*($Q_m$−2) and the value of ($Q_m$−2)*$N_{RE}$. Wherein the function represents rounding down, rounding up, rounding and retaining the original value.

Example 1-4 for TBS determination by considering the constraint condition for Ns.

Assume that $n_{PRB}$=25 and the number of REs per PRB is 144, Rs=⅓, Rc=⅗, 16QAM ($Q_m$=4=2*m), and the number of layer is 1, so the total number of REs is $N_{RE}$=25*144.

1) Rs can represent the value of Ks/Ns, so $R_{eff}$=(Rs−1)*(m−1)/m+Rc=⁴⁄₁₅. Assume that the number of CRC bits for code block is equal to 0 (CB_CRC=0), then 2) TBS_temp=$N_{RE}*Roff*Q_m*v$=3840. Quantize the TBS_temp as the following: If TBS_temp>3824, n=floor(log2(TBS_temp−24))−5=6, TBS_modify=$2^n$*round((TBS_temp−24)/$2^n$)=3840, TBS=3840.

$$Kc+Ks=3840+24=3864.\ Kc/Ks=(Rc*m/(m-1)-1)/ \\ Rs=\tfrac{3}{5}.\Rightarrow Kc=1439, Ks=2415. \qquad \text{Equation 1}$$

3) CC_temp=$N_{RE}*Rc*Q_m*v$=8640. Quantize the CC_temp as the following: If Rc>¼ and CC_temp>8424, C=2, CC_modify=8640, Equation 2: Ns+Kc=8640. Equation 3: Ns=Ks/Rs.

Use the equations: Kc+Ks=3864 and δ=Kc/Ks=⅗ to generate Ks_temp=241. Then, use the equations: Ns=min{floor{(Ks_temp/Rs)/(2*(m−1))}*(2*(m−1)), 2*(m−1)*$N_{RE}$}=7200 and Ns+Kc=8640 to generate Kc=1440 and Ks=2424.

The effective code rates can be obtained as eff_Rs=Ks/Ns=0.3367; eff_Rc=(Ns+Kc)/(Ns+Ns/(m−1))=0.6=Rc; and $R_{eff}$=(TBS+$L_{TB\_CRC}$)/(Ns+Ns/(m−1))=0.2667.

The number of symbols mapped into the resource can be calculated as Nx=Ns/(2*(m−1))=3600=$N_{RE}$.

Embodiment 4: Restriction on TBS Determination

Figure 6:
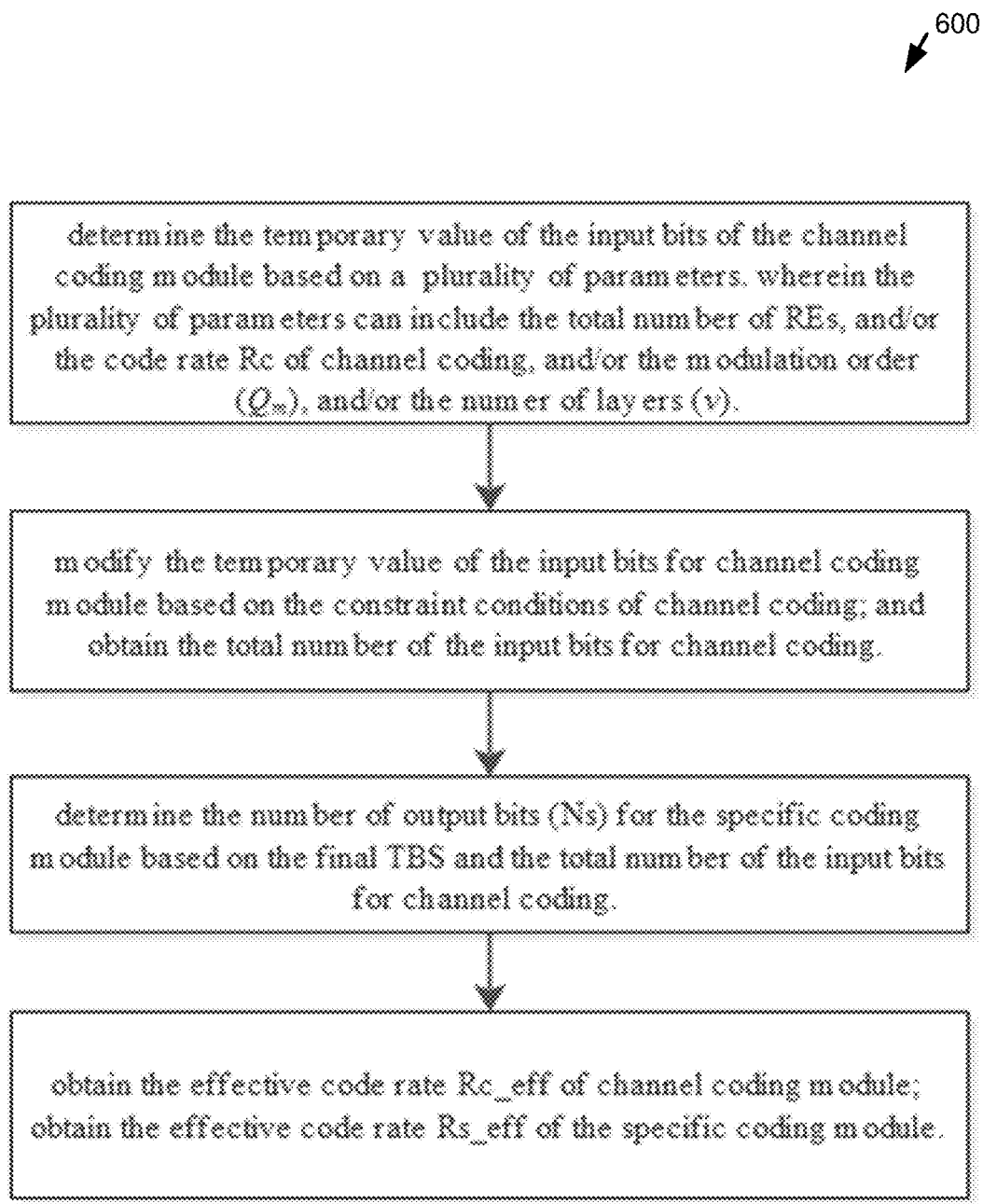
FIG. 6 is an example flow chart for the determination of effective code rate for the specific coding and LDPC coding module.

The flow chart in FIG. 6 can show the determination procedure of the effective code rate for the specific coding module and the LDPC coding module.

FIG. 6 is an example flow chart 600 for the determination of effective code rate for the specific coding and LDPC coding module. If the UE met the restriction conditions, the UE can ignore the scheduled data transmission, and/or the UE assumes that the scheduled data transmission is not received successfully.

Wherein the restriction conditions can include at least one of the following: 1) the effective code rate $R_{eff}$ of TBS is not larger than the code rate Rs of the specific coding module determined by DCI indication; 2) the effective code rate Rs_eff of the specific coding module is larger than the code rate Rs of the specific coding module determined by DCI indication; 3) the effective code rate Rc_eff of the channel coding module is larger than 0.95; 4) the number of input bits of the specific coding module is equal to 0 when the high-layer parameter related to the specific coding operation is not configured to the UE; 5) the number of input bits of the specific coding module is larger than a threshold when the high-layer parameter related to the specific coding operation is configured to the UE.

The effective code rate of the specific coding module or channel coding module can be defined as the number of input bits including the CRC bits divided by the number of output bits which are available to be mapped into the physical channel resource on PDSCH or PUSCH.

In some embodiments, the UE does not expect the effective code rate Rs_eff of the specific coding module is larger than the code rate Rs of the specific coding module determined by DCI indication.

In some embodiments, the UE does not expect the effective code rate Rc_eff of the channel coding module is larger than 0.95.

In some embodiments, when the high-layer parameter related to the specific coding operation is configured to the UE, the information bits used for the specific coding operation is larger than 8 and smaller than the value of TBS.

In some embodiments, if the specific coding operation is available for the UE, the TBS should not be larger than a threshold. Wherein the threshold is not smaller than 3824.

Embodiment 5: MCS Indication of Code Rate

In some embodiment, the information bits of each code block for channel coding include one or more bits of the Kc which is not smaller than 2*Zc. In some embodiments, if the part of the information bits of the Kc in each code block size is smaller than 2*Zc, padding bits should be attached after the part of the information bits of the Kc.

In the MCS table, for the radio link combining the specific coding operation and channel coding operation, the effective code rate for TBS is $SE_{eff}=R_{eff} \times Qm=2(m-1)\times(Rd-1)+2m\times Rc$, and the spectrum efficiency is corresponding to MCS index.

In some embodiments, the MCS index indicated by a DCI can be used to determine the code rate of the specific coding operation Rs, the code rate of channel coding Rc, the modulation order $Q_m$, and the spectrum efficiency. The effective code rate $R_{eff}$ used to determine $N_{info}$ can be determined by Rs, Rc and $Q_m$.

In some embodiments, the MCS index indicated by a DCI can be used to determine the code rate of the specific coding operation Rs, the target code rate Rt, the modulation order $Q_m$, and the spectrum efficiency. The effective code rate of LDPC coding Rc_eff can be determined by Rs, Rt and $Q_m$.

In some embodiments, the MCS index indicated by a DCI can be used to determine the code rate of LDPC coding Rc, the target code rate Rt, the modulation order $Q_m$, and the spectrum efficiency. The effective code rate of the specific coding operation Rs_eff can be determined by Rc, Rt and $Q_m$.

In some embodiments, the MCS index indicated by a DCI can be used to determine the ratio of the two parts of information bits split by the bit splitting module.

In some embodiments, the each MCS entry corresponds to a MCS index, a target code rate Rc for channel coding, a target code rate Rs for the specific coding, modulation order ($Q_m$) and the spectrum efficiency (SE).

In some embodiments, Rc corresponding to the MCS entry in the MCS table should be satisfied with the condition $$Rc \geq \frac{2Q_m - 2}{Q_m}.$$

Embodiment 6: Code Block Information Bits Allocation for Channel Coding

In some embodiments, the total output bits of the specific coding operation should be transmitted in the physical channel.

In some embodiments, the output bits of the specific coding operation should not be punctured.

In some embodiments, the channel coding represents the LDPC coding.

In some embodiments, the output bits of the specific coding operation should not be set at the first 2*Zc bit locations of a LDPC code block. Wherein the Zc is the lifting size for the LDPC coding.

In some embodiments, the number of input bits for LDPC coding except for the output bits of the specific coding operation should not be smaller than the value of 2*Zc*C. Wherein the Zc is the lifting size for the LDPC coding. Wherein the C is the number of code blocks for the LDPC coding.

In some embodiments, the number of input bits for LDPC coding except for the output bits of the specific coding operation can be evenly divided by the value of 2*Zc. Wherein the Zc is the lifting size for the LDPC coding.

Wherein the number of input bits for LDPC coding except for the output bits of the specific coding operation is noted as Kc.

Method 1: the total bits of Kc are allocated in each LDPC code block for a TB. In this method, the first 2*Zc bits in each LDPC code block are punctured, so the first 2*Zc bits are set as the part of bits of Kc.

Examples 1 to 2 show the LDPC code block information allocation for the cases of only one LDPC code block for a TB. Examples 3-4 show the LDPC code block information allocation for the cases with LDPC code block segmentation for a TB. Example 1 as shown in FIG. 6, if Kc<2*Zc, there are 2*Zc-Kc padding bits should be added after the information bits of the Kc. Wherein the padding bits are all zeros, or all ones, or a predefined bit sequence.

Figure 7:
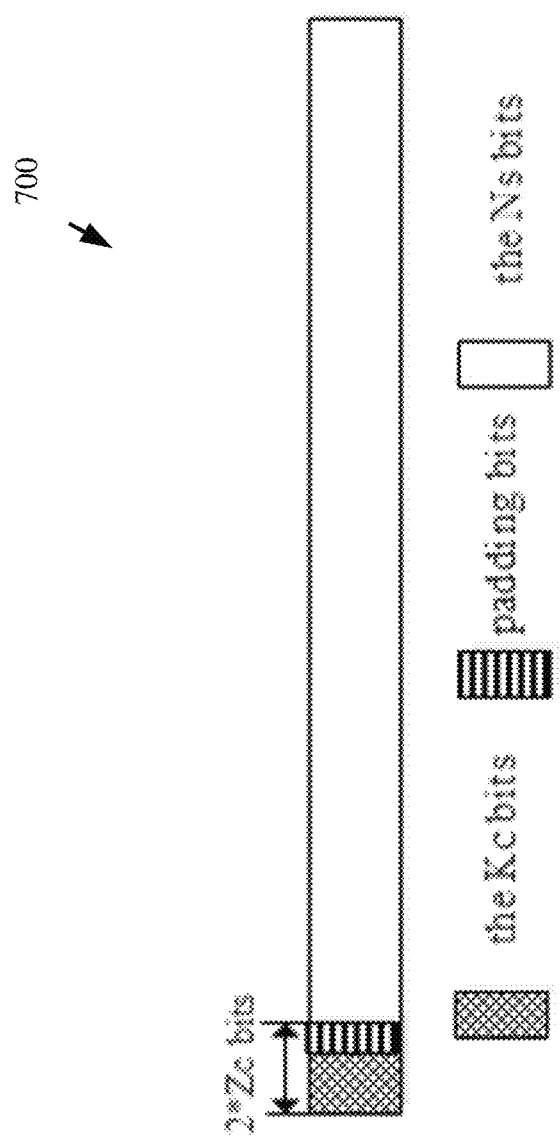
FIG. 7 is a block diagram for example LDPC code block information allocation based on radio link combining the operations of the specific coding and the LDPC coding.

FIG. 7 is a block diagram 700 for example LDPC code block information allocation based on radio link combining the operations of the specific coding and the LDPC coding.

Figure 8A:
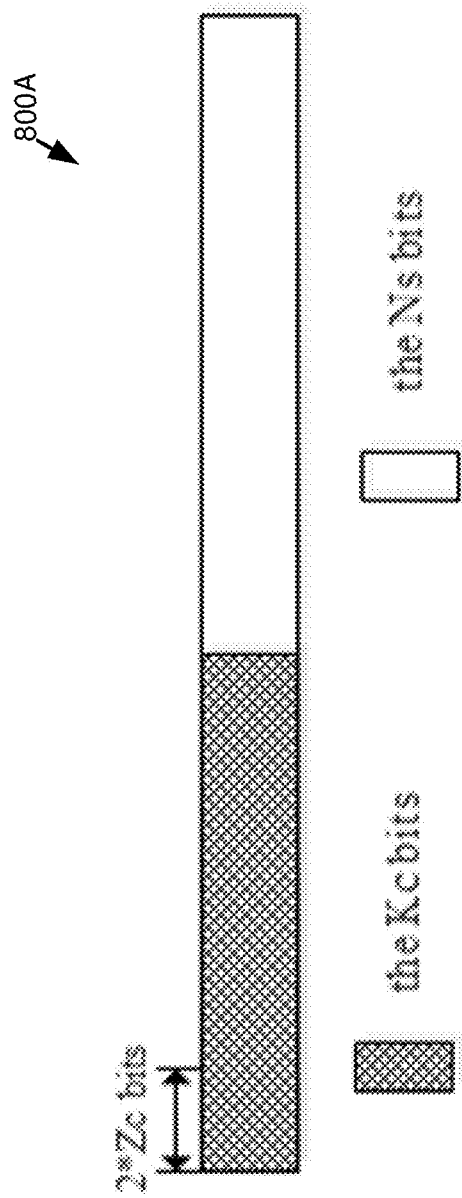
FIGS. 8A-8B are example block diagrams for example LDPC code block information allocation based on radio link combining the operations of the specific coding and the LDPC coding.
Figure 8B:
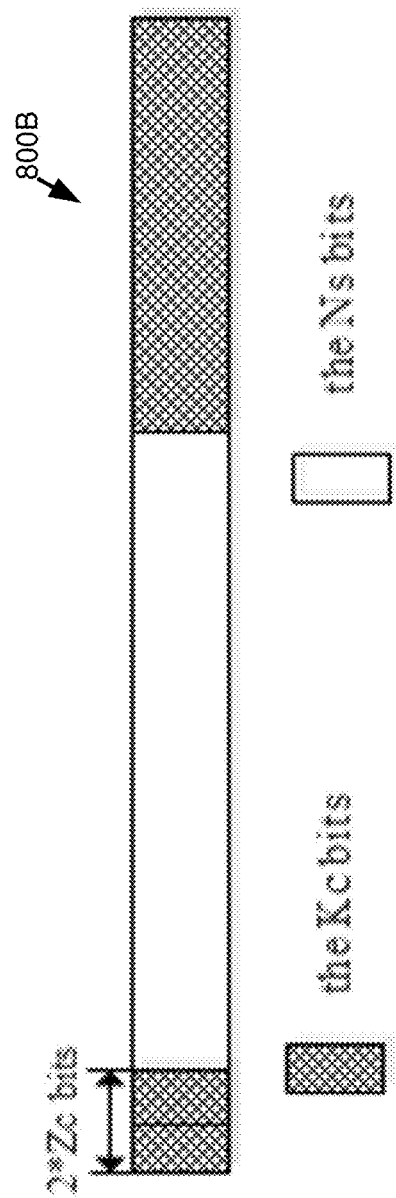

Example 2, if Kc>2*Zc, then Scheme 1: put the bits of Kc at the significant bit locations of each LDPC code block as shown in FIG. 8(a). Scheme 2: put the (2*Zc) bits of Kc at the significant bit locations of each LDPC code block, and put the reminding bits of Kc at the other bit locations of the each code block, such as the lower bit locations as shown in FIG. 8(b).

FIG. 8 is a block diagram 800 for example LDPC code block information allocation based on radio link combining the operations of the specific coding and the LDPC coding. Scheme 3: put the (2*Zc) bits of Kc at the significant bit locations of each LDPC code block and put the reminding bits of Kc at the highest bit locations of each modulated symbol of each code block after the information bits of the code block permuted by the LDPC interleaver as shown in FIG. 8. Then the reminding bits of Kc can represent the symbol ('+' or '−') bit location of a modulated symbol. If the number of Kc bits is not enough to occupy the highest bit location of each modulated symbol of each code block, the padding bits should be added after the bits of Kc.

Figure 9:
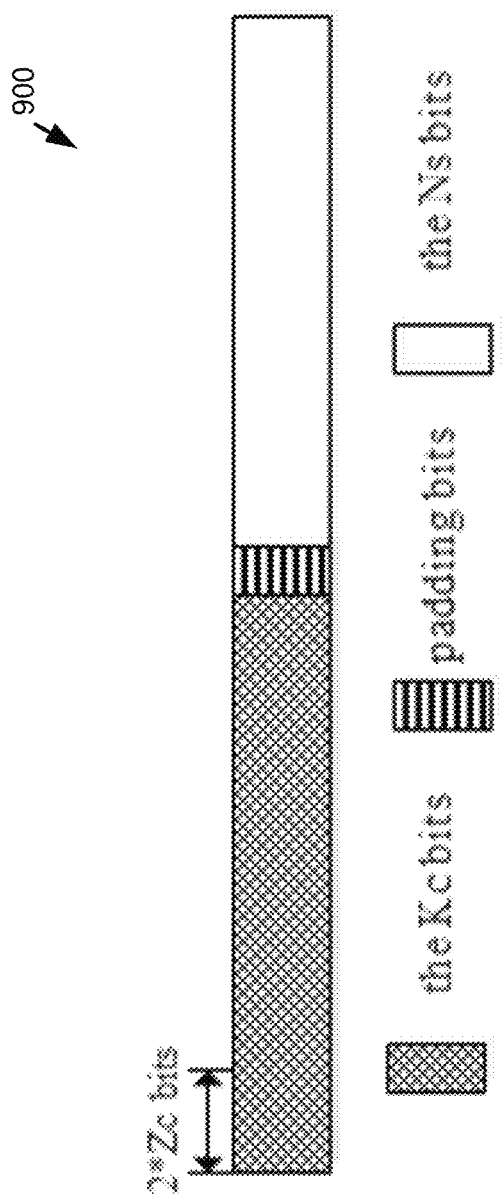
FIG. 9 is a block diagram for example LDPC code block information allocation based on radio link combining the operations of the specific coding and the LDPC coding.

FIG. 9 is a block diagram 900 for example LDPC code block information allocation based on radio link combining the operations of the specific coding and the LDPC coding.

Example 3: if Kc<2*Zc*C, Scheme 1, put the Kc bits into the significant bit locations or the head of each code block by dividing the total number of Kc bits equally into the code blocks of the TB. Put the padding bits into the first bit locations in the rang of func(Kc/C)+1~2*Zc of each code block as shown in FIG. 9. In some embodiments, the func(Kc/C) represents that if the Kc/C is not an integer, it is equal to the value of floor (Kc/C) for the first mod(Kc, C) code blocks; and it is equal to the value of ceil(Kc/C) for the remaining (C-mod(Kc, C)) code blocks. Wherein the floor(•) represents rounding down the "•". The ceil(•) represents rounding up the "•".

Figure 10:
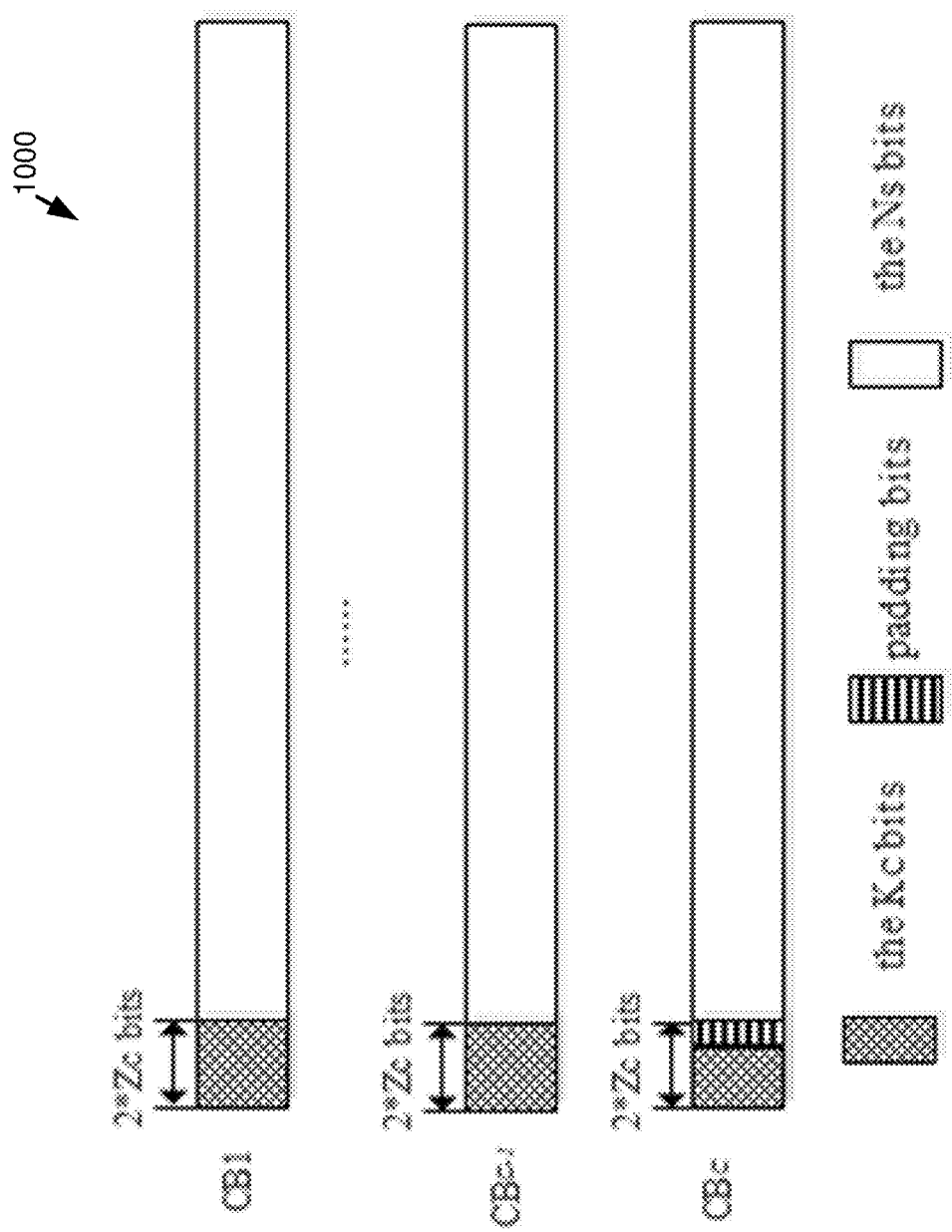
FIG. 10 is a block diagram for example LDPC code block information allocation based on radio link combining the operations of the specific coding and the LDPC coding.

FIG. 10 is a block diagram 1000 for example LDPC code block information allocation based on radio link combining the operations of the specific coding and the LDPC coding. Scheme 2, put the Kc bits into the (2*Zc) significant bit locations or the head of each code block from the first code block to the n-th code block until all of the Kc bits are located. For the code blocks that the first (2*Zc) bits are not totally filled with Kc bits, the padding bits can be located at the reminding bit locations.

For example, if Kc>(C−1)*2*Zc, Kc bits shall be firstly located at the first (2*Zc) bits of CB1~CBC−1. For the CBC, the padding bits shall be located after the bit location of (Kc−(C−1)*2*Zc+1)-th bit to the (2*Zc)-th bit location as shown in FIG. 10.

Figure 11:
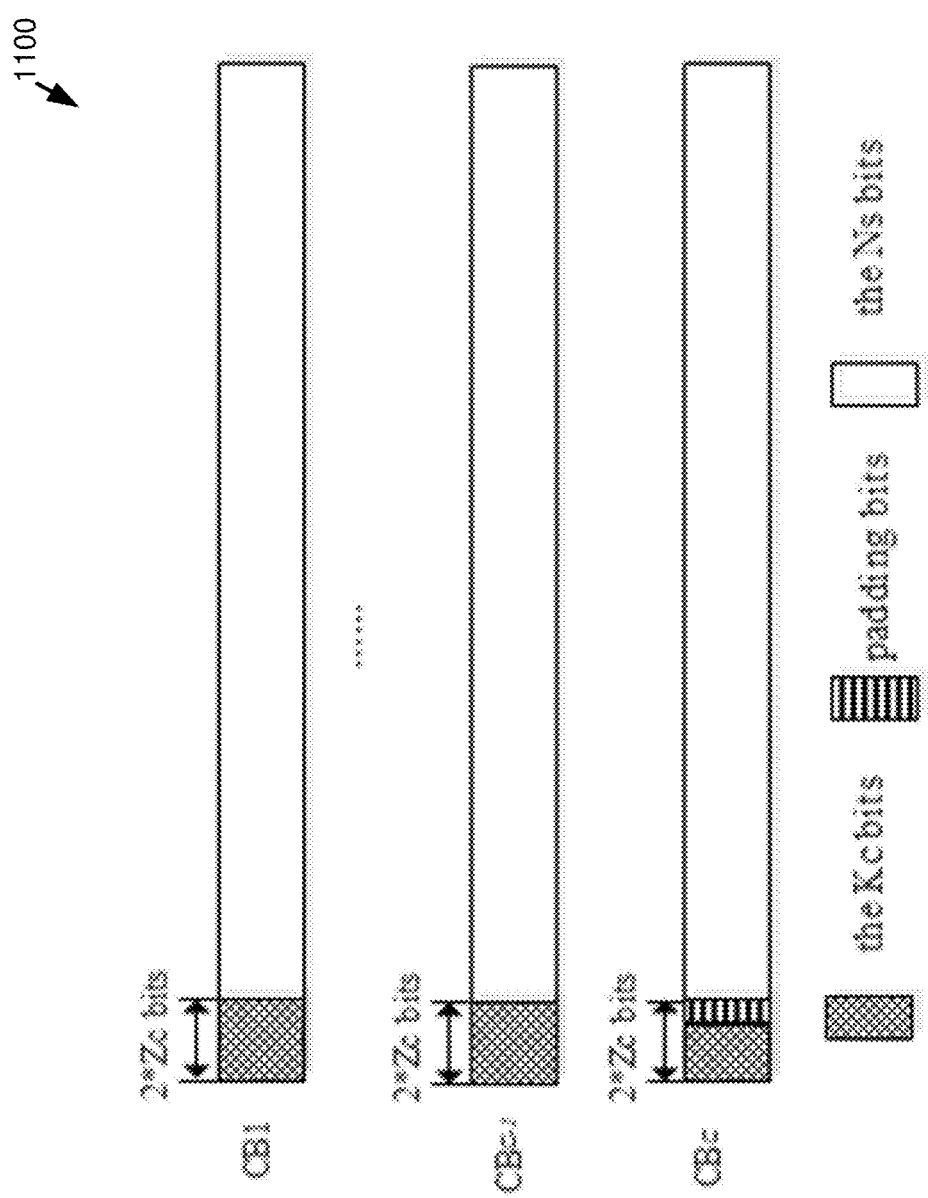
FIG. 11 is a block diagram for example LDPC code block information allocation based on radio link combining the operations of the specific coding and the LDPC coding.

FIG. 11 is a block diagram 1100 for example LDPC code block information allocation based on radio link combining the operations of the specific coding and the LDPC coding.

Scheme 3, if Kc≥2*Zc*C, the code block information allocation schemes of Example 2 can be reused for each code block of the TB.

Method 2: constraint condition for the value of Kc for a TB. The value of Kc bits for a TB should be satisfied with (Kc mod CBS)≥2*Zc. First, the Kc bits can be put into all of the bit locations from the first code block to the C-th code block until all of the Kc bits are located. Then put the Ns bits into the reminding bit locations of the reminding code blocks. For example, there are n1 code blocks totally carrying Kc bits, n2 code blocks totally carrying Ns bits, and one code blocks CBn1+1 carrying both a part of Kc bits and a part of Ns bits as shown in FIG. 11.

In some embodiments, for the code blocks (e.g. CB1 to CBn1) totally filling with Kc bits, the code blocks should be additionally punctured (C−n1)*2*Zc bits. In some embodiments, for the code blocks (e.g. CBn1+2 to CBC) filling with Ns bits, the code blocks should not be punctured the first 2*Zc bits.

Figure 12:
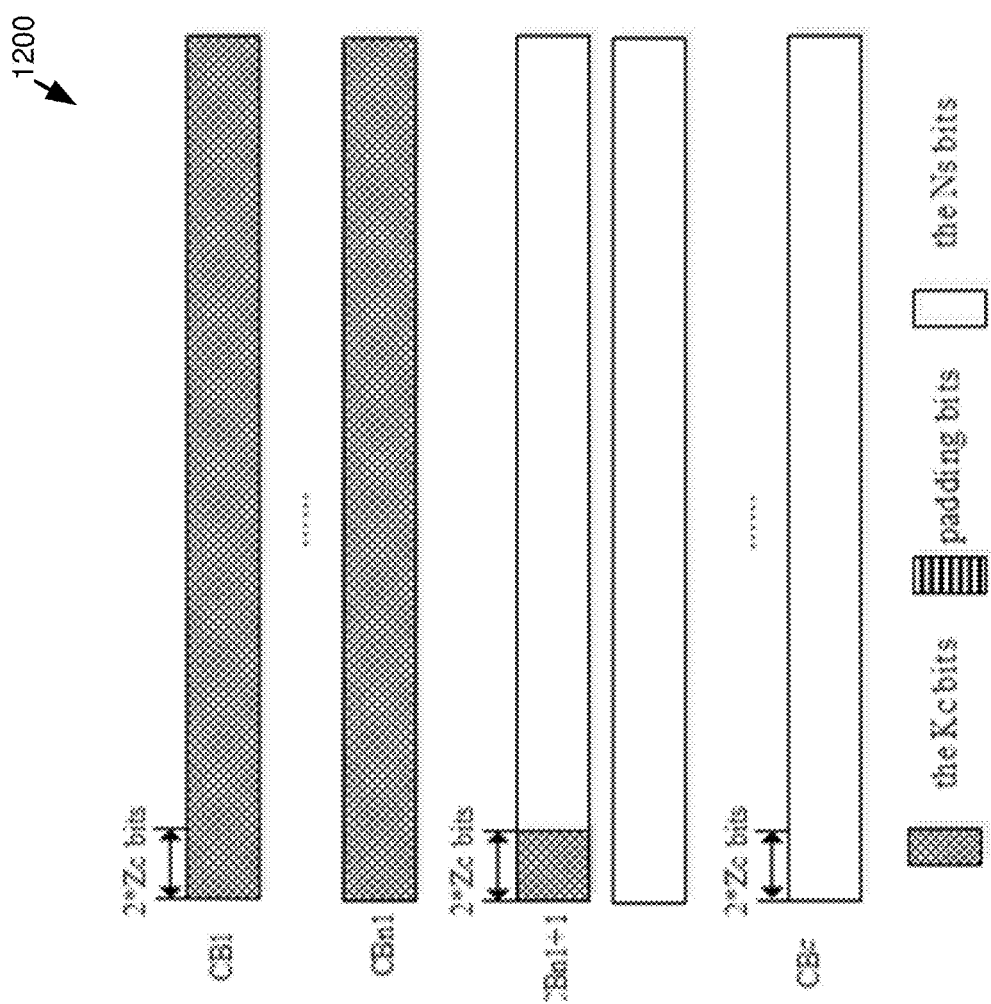
FIG. 12 is a block diagram for example LDPC code block information allocation based on radio link combining the operations of the specific coding and the LDPC coding.

FIG. 12 is a block diagram 1200 for example LDPC code block information allocation based on radio link combining the operations of the specific coding and the LDPC coding. In some embodiments, the padding bits in the above Methods 1 and 2 can be attached in the first bit locations of a LDPC code block and the number of information bits Kc can be located at the bit locations after the padding bits.

Figure 13:
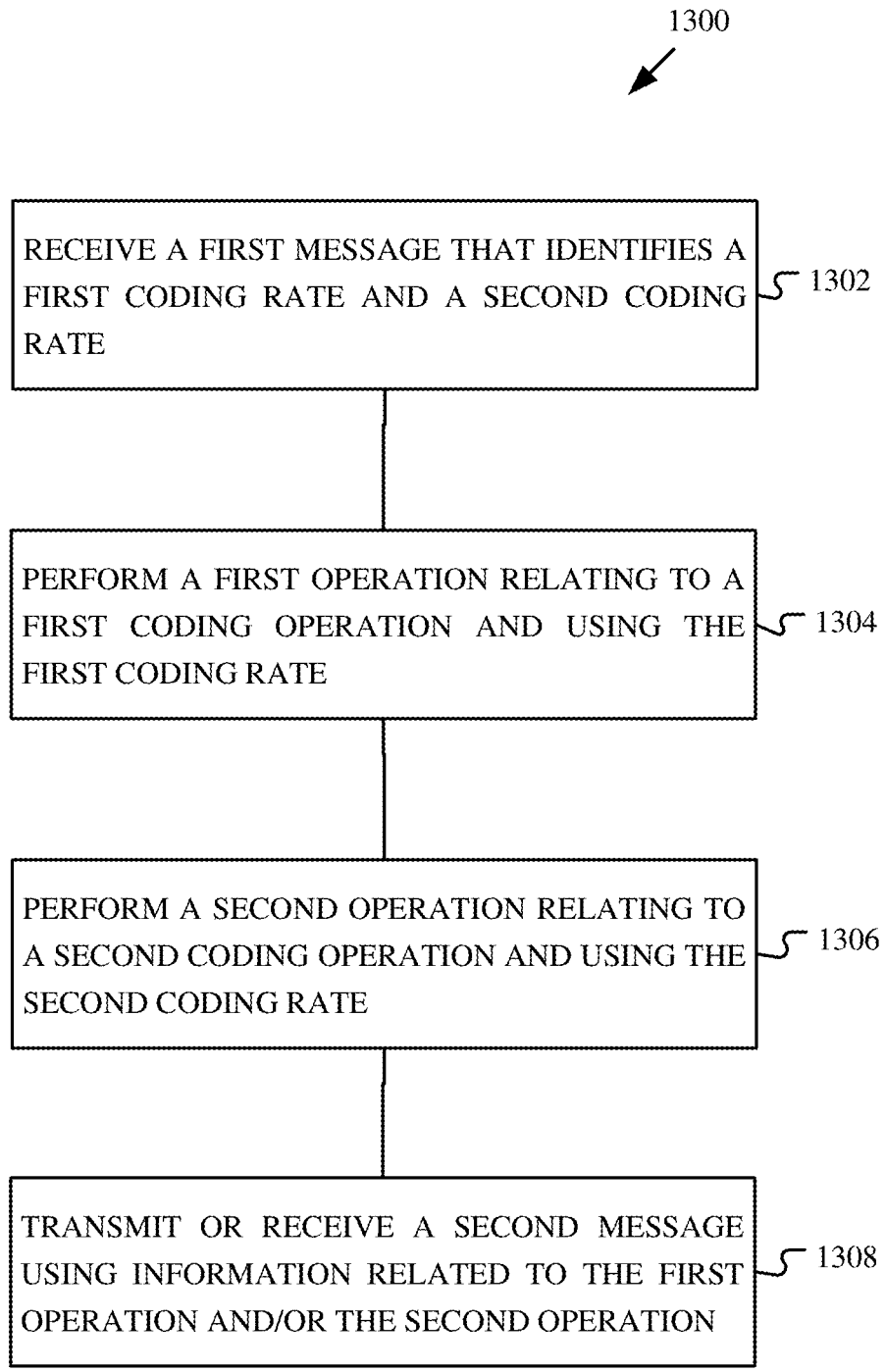
FIG. 13 is a block diagram 1300 of a method for determining a transport block size.

FIG. 13 is a block diagram 1300 of a method for determining a transport block size. The method can include receiving, by a terminal, a first message that identifies a first coding rate and a second coding rate (block 1302). The method can also include performing, by the terminal, a first operation relating to a first coding operation and using the first coding rate (block 1304). The method can also include performing, by the terminal, a second operation relating to a second coding operation and using the second coding rate (block 1306). The method can also include: transmitting or receiving, by the terminal, a second message using information related to the first operation and/or the second operation. (block 1308).

In some embodiments, the first coding operation includes a low-density parity check (LDPC) coding operation.

In some embodiments, the first coding operation includes any of a polar coding operation, a turbo coding operation, or a convolutional coding operation.

In some embodiments, the second coding operation including any of a bit-to-symbol coding operation and a symbol-to-bit conversion operation In some embodiments, the second coding operation includes distribution matching operation and a signaling shaping operation.

In some embodiments, any of the first operation and second operation is a transport block size (TBS) determination operation.

In some embodiments, any of the first operation and second operation is a modulation and coding scheme (MCS) indication operation.

In some embodiments, a code block segmentation and base graph selection operation for the first coding operation are related to the second operation.

In some embodiments, the method includes determining, by the terminal, a temporary TBS value by deriving a product of a code rate, the modulation order, the number of layers, the total number of resource elements ($N_{RE}$), and wherein the $N_{RE}$ is determined by using a number of allocated PRBs.

In some embodiments, the code rate is determined by the first coding rate and/or the second coding rate.

In some embodiments, the $N_{RE}$ does not include the number of REs that is not available for data transmission.

In some embodiments, the method includes determining, by the terminal, a temporary TBS value includes a first part temporary TBS value and a second part temporary TBS value, and modifying, by the terminal, each part temporary TBS value by a modification method to generate a modified first part TBS value and a modified second part TBS value, and determining, by the terminal, the final TBS value based on at least the modified first part TBS value and the modified second part TBS value, and wherein the first part temporary TBS value is determined by at least the first coding rate, and wherein the second part temporary TBS value is determined by at least . . . the second coding rate.

In some embodiments, the method includes modifying, by the terminal, the temporary TBS value by a modification method to generate a modified TBS value; modifying, by the terminal, the modified TBS value to generate a first part modified TBS value and a second part modified TBS value based on at least one of the first coding rate, the second coding rate, a ratio and a predefined function; and determining, by the terminal, the final TBS value by combining the first part modified TBS value and the second part modified TBS value.

In some embodiments, the ratio is determined by the first coding rate, the second coding rate and/or the modulation order.

In some embodiments, the modification method includes at least a rounding operation, a quantization value related to a threshold value to generate a modified TBS value, and wherein the threshold is related to the first coding rate and the second coding rate.

In some embodiments, the predefined function includes any of a rounding operation, a rounding down operation, a rounding up operation, a multiplication operation using a modifying factor, a dividing operation using the modifying factor, and a subtraction operation using a number of CRC bits, wherein the modifying factor is related to a number of code blocks for any of the first coding operation and the second coding operation.

In some embodiments, the method includes receiving, by the terminal, a third message comprising a plurality of base graph parameters related to base graph selection for a first coding operation; and selecting, by the terminal, a base graph based on the plurality of base graph parameters, wherein the plurality of base graph parameters include at least a second coding rate related to the second coding operation.

In some embodiments, a second base graph is selected responsive to determining that a second base graph condition is met, the second base graph condition including any of: determining whether a number of information bits is not larger than a first threshold, determining whether the number of information bits is not larger than a second threshold and a code rate for the first coding operation is not larger than a third threshold, and determining whether the code rate for the first coding operation is not larger than a fourth threshold.

In some embodiments, a first LDPC base graph is selected responsive to determining that a first base graph condition is met, the first base graph condition including any of: determining whether a number of information bits is not larger than a second threshold and a first code rate for the first coding operation is larger than a fourth threshold, and determining whether the number of information bits is not larger than a second threshold and the number of information bits is larger than a first threshold and the code rate for the first coding operation is larger than a third threshold.

In some embodiments, the number of information bits includes input bits of the second coding operation or the final TBS value, and the first threshold and/or the second threshold is related to the second coding rate of the second coding operation, the modulation order, the first coding rate of the first coding operation, and/or a number of CRC bits attached to a transport block (TB) or a code block (CB), and the third threshold and/or the fourth threshold is related to the code rate of the second coding operation and the first coding rate of the first coding operation.

In some embodiments, a number of information bits is not smaller than twice a lifting size for the channel operation, wherein the information bits are part of a TB except for input bits for the second coding operation.

In some embodiments, the information bits of a code block are located at upper or head bit locations of the code block of the first coding operation, wherein the information bits of a code block are part of a TB used for the first coding operation except for the bits output by the second coding operation.

In some embodiments, if the number of information bits of a code block of the first coding operation is smaller than twice a lifting size for the first coding operation, a set of padding bits are added at a first bit locations of twice the lifting size of a code block except for bit locations of the set of information bits, and wherein the set of information bits are part of input bits of a code block of the first coding operation except for the bits output from the second coding operation.

In some embodiments, the first coding rate and the second coding rate can be determined by the available MCS table and the MCS index indicated by a downlink control signaling.

In some embodiments, the first coding rate corresponds to an MCS index in an MCS table that is satisfied that the first coding rate is not smaller than a threshold, and wherein the threshold is related to a value of a modulation order corresponding to the MCS index.

Example Wireless System

Figure 14:
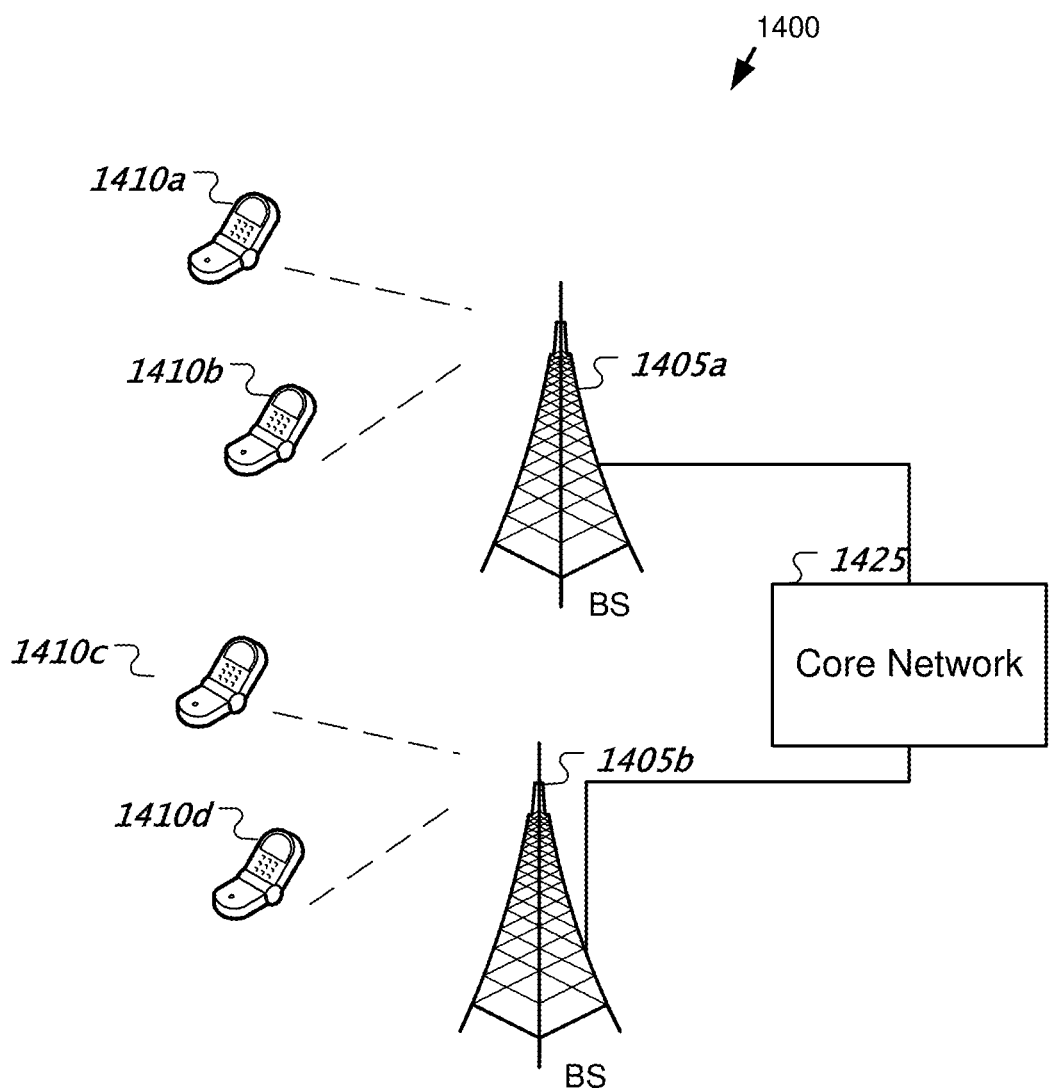
FIG. 14 shows an example of a wireless communication system where techniques in accordance with one or more embodiments of the present technology can be applied.

FIG. 14 shows an example of a wireless communication system where techniques in accordance with one or more embodiments of the present technology can be applied. A wireless communication system 1400 can include one or more base stations (BSs) 1405a, 1405b, one or more wireless devices or terminals 1410a, 1410b, 1410c, 1410d, and a core network 1425. A base station 1405a, 1405b can provide wireless service to wireless devices 1410a, 1410b, 1410c and 1410d in one or more wireless sectors. In some implementations, a base station 1405a, 1405b includes directional antennas to produce two or more directional beams to provide wireless coverage in different sectors. The base station may implement functionalities of a scheduling cell or a candidate cell, as described in the present document.

The core network 1425 can communicate with one or more base stations 1405a, 1405b. The core network 1425 provides connectivity with other wireless communication systems and wired communication systems. The core network may include one or more service subscription databases to store information related to the subscribed wireless devices 1410a, 1410b, 1410c, and 1410d. A first base station 1405a can provide wireless service based on a first radio access technology, whereas a second base station 1405b can provide wireless service based on a second radio access technology. The base stations 1405a and 1405b may be co-located or may be separately installed in the field according to the deployment scenario. The wireless devices 1410a, 1410b, 1410c, and 1410d can support multiple different radio access technologies.

In some implementations, a wireless communication system can include multiple networks using different wireless technologies. A dual-mode or multi-mode wireless device includes two or more wireless technologies that could be used to connect to different wireless networks.

Figure 15:
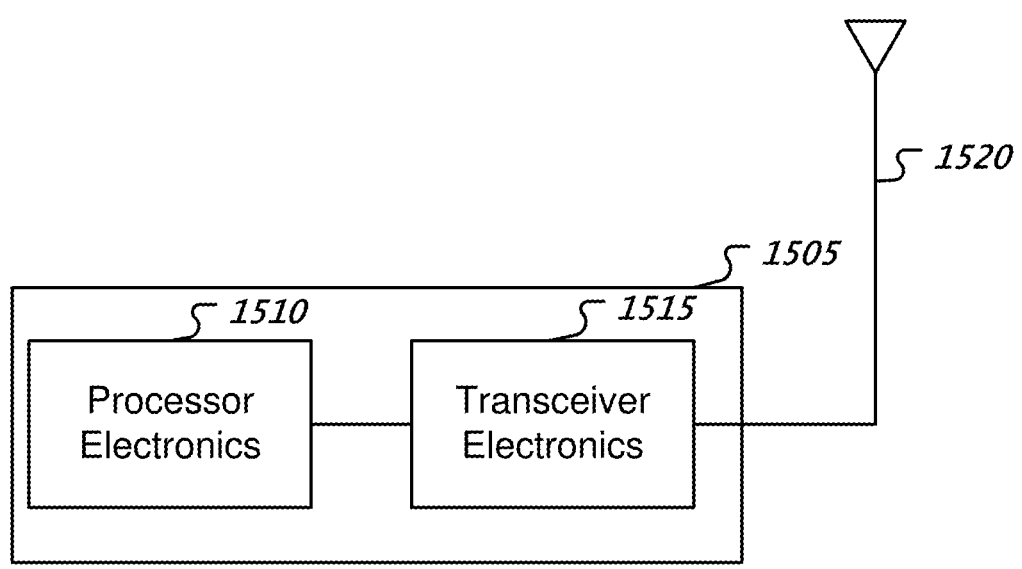
FIG. 15 is a block diagram representation of a portion of a hardware platform.

FIG. 15 is a block diagram representation of a portion of a hardware platform. A hardware platform 1505 such as a network node or a base station or a terminal or a wireless device (or UE) can include processor electronics 1510 such as a microprocessor that implements one or more of the techniques presented in this document. The hardware platform 1505 can include transceiver electronics 1515 to send and/or receive wired or wireless signals over one or more communication interfaces such as antenna 1520 or a wireline interface. The hardware platform 1505 can implement other communication interfaces with defined protocols for transmitting and receiving data. The hardware platform 1505 can include one or more memories (not explicitly shown) configured to store information such as data and/or instructions. In some implementations, the processor electronics 1510 can include at least a portion of the transceiver electronics 1515. In some embodiments, at least some of the disclosed techniques, modules or functions are implemented using the hardware platform 1505.

Conclusion

The disclosed and other embodiments, modules and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable . . . results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:

1. A method for wireless communication, comprising:
   receiving, by a terminal, a first message that identifies a first coding rate and a second coding rate;
   performing, by the terminal, a first operation relating to channel coding and using the first coding rate, wherein the performing the first operation includes determining a first part temporary TBS value by at least the first coding rate;
   performing, by the terminal, a second operation relating to a specific coding operation and using the second coding rate, wherein the performing the second operation includes determining a second part temporary TBS value by at least the second coding rate;
   modifying, by the terminal, each part temporary TBS value by a modification method to generate a modified first part TBS value and a modified second part TBS value;
   determining, by the terminal, a final TBS value based on at least the modified first part TBS value and the modified second part TBS value; and
   performing a communication, by the terminal, of a second message that includes a number of information bits according to the final TBS value.

2. The method of claim 1, wherein the performing the communication includes 1) transmitting the second message using information related to the first operation and the second operation, or 2) receiving the second message using the information related to the first operation and the second operation.

3. The method of claim 1, wherein the channel coding includes a low-density parity check (LDPC) coding operation.

4. The method of claim 1, wherein any of the first operation and the second operation is 1) a transport block size (TBS) determination operation or 2) a modulation and coding scheme (MCS) indication operation.

5. The method of claim 1, further comprising:
   determining, by the terminal, a temporary TBS value by deriving a product of a code rate, a modulation order, a number for layers, and a total number of resource elements ($N_{RE}$), and wherein the $N_{RE}$ is determined by using a number of allocated PRBs.

6. The method of claim 5, further comprising:
   modifying, by the terminal, the temporary TBS value by the modification method to generate a modified TBS value;
   modifying, by the terminal, the modified TBS value to generate a first part modified TBS value and a second part modified TBS value based on at least one of the first coding rate, the second coding rate, a ratio and a predefined function, wherein the ratio is determined by the first coding rate, the second coding rate and/or the modulation order; and
   determining, by the terminal, another final TBS value by combining the first part modified TBS value and the second part modified TBS value.

7. The method of claim 6, wherein the predefined function includes any of a rounding operation, a rounding down operation, a rounding up operation, a multiplication operation using a modifying factor, a dividing operation using the modifying factor, and a subtraction operation using a number of CRC bits, wherein the modifying factor is related to a number of code blocks for any of the channel coding and the specific coding operation.

8. The method of claim 1, wherein the modification method includes at least a rounding operation, a quantization value related to a threshold value to generate a modified TBS value, and wherein the threshold value is related to the first coding rate and the second coding rate.

9. The method of claim 1, wherein the number of the information bits is not smaller than twice a lifting size for a low-density parity check (LDPC) coding operation, and wherein the information bits are part of a TBS except for input bits for the specific coding operation.

10. The method of claim 9, wherein the information bits of a code block are located at upper or head bit locations of the code block of the channel coding; wherein the information bits of the code block are part of a TBS used for the channel coding except for a bits output by the specific coding operation.

11. The method of claim 9, wherein if the number of information bits of a code block of the channel coding is smaller than twice the lifting size for the LDPC coding operation, a set of padding bits are added at a first bit locations of twice the lifting size of the code block except for bit locations of the set of information bits, and wherein the set of information bits are part of input bits of the code block of the channel coding except for a bits output from the second specific coding operation.

12. A terminal for wireless communication comprising one or more processors configured to cause the terminal to implement a method, comprising:
  receive a first message that identifies a first coding rate and a second coding rate;
  perform a first operation relating to channel coding and using the first coding rate, wherein the perform the first operation includes determine a first part temporary TBS value by at least the first coding rate;
  perform a second operation relating to a specific coding operation and using the second coding rate, wherein the perform the second operation includes determine a second part temporary TBS value by at least the second coding rate;
  modify each part temporary TBS value by a modification method to generate a modified first part TBS value and a modified second part TBS value;
  determine a final TBS value based on at least the modified first part TBS value and the modified second part TBS value; and
  perform a communication of a second message that includes a number of information bits according to the final TBS value.

13. The terminal of claim 12, wherein the perform the communication includes 1) transmit the second message using information related to the first operation and the second operation, or 2) receive the second message using the information related to the first operation and the second operation.

14. The terminal of claim 12, wherein the channel coding includes a low-density parity check (LDPC) coding operation.

15. The terminal of claim 12, wherein any of the first operation and the second operation is 1) a transport block size (TBS) determination operation or 2) a modulation and coding scheme (MCS) indication operation.

16. The terminal of claim 12, wherein the one or more processors are further configured to cause the terminal to:
  determine a temporary TBS value by deriving a product of a code rate, a modulation order, a number for layers, and a total number of resource elements ($N_{RE}$), and wherein the $N_{RE}$ is determined by using a number of allocated PRBs.

17. The terminal of claim 16, wherein the one or more processors are further configured to cause the terminal to:
  modify the temporary TBS value by the modification method to generate a modified TBS value;
  modify the modified TBS value to generate a first part modified TBS value and a second part modified TBS value based on at least one of the first coding rate, the second coding rate, a ratio and a predefined function, wherein the ratio is determined by the first coding rate, the second coding rate and/or the modulation order; and
  determine another final TBS value by combining the first part modified TBS value and the second part modified TBS value.

18. The terminal of claim 12, wherein the modification method includes at least a rounding operation, a quantization value related to a threshold value to generate a modified TBS value, and wherein the threshold value is related to the first coding rate and the second coding rate.

19. The terminal of claim 17, wherein the predefined function includes any of a rounding operation, a rounding down operation, a rounding up operation, a multiplication operation using a modifying factor, a dividing operation using the modifying factor, and a subtraction operation using a number of CRC bits, wherein the modifying factor is related to a number of code blocks for any of the channel coding and the specific coding operation.

20. The terminal of claim 12, wherein the number of the information bits is not smaller than twice a lifting size a low-density parity check (LDPC) coding operation, and wherein the information bits are part of a TBS except for input bits for the specific coding operation.

* * * * *

UNITED STATES PATENT AND TRADEMARK OFFICE
CERTIFICATE OF CORRECTION

PATENT NO. : 12,425,125 B2
APPLICATION NO. : 18/154266
DATED : September 23, 2025
INVENTOR(S) : Qiujin Guo et al.

It is certified that error appears in the above-identified patent and that said Letters Patent is hereby corrected as shown below:

On the Title Page

On Page 2, item (56), under "OTHER PUBLICATIONS", in Column 2, Line 1, delete "Zte" and insert --ZTE--
On Page 2, item (56), under "OTHER PUBLICATIONS", in Column 2, Line 11, delete "Zte" and insert --ZTE--

In the Specification

In Column 11, Line 49, delete "φ" and insert --φ$_i$--
In Column 11, Line 54, delete "$$Num(\varphi_j) = \text{round}\left(Na \cdot \sum_{j=0}^{i} Pr\{\varphi_j\}\right) - \text{round}\left(Na \cdot \sum_{j=0}^{i-1} Pr\{\varphi_j\}\right),$$"

and insert

--$$Num(\varphi_i) = \text{round}\left(Na \cdot \sum_{j=0}^{i} Pr\{\varphi_j\}\right) - \text{round}\left(Na \cdot \sum_{j=0}^{i-1} Pr\{\varphi_j\}\right),$$--

In Column 11, Line 61, delete "round(5.0.4)=2," and insert --round(5·0.4)=2,--
In Column 12, Line 5, delete "Pr{5}-0.3," and insert --Pr{5}=0.3,--
In Column 12, Line 58, delete "5 (b)," and insert --5(b),--

In Column 15, Line 65, delete

Signed and Sealed this
Ninth Day of December, 2025

John A. Squires
*Director of the United States Patent and Trademark Office*

CERTIFICATE OF CORRECTION (continued)
U.S. Pat. No. 12,425,125 B2

"$$\sum_{a<A_i} T_i(A_0, A_1, A_{i-1}, a) \leq I_i < \sum_{a \leq A_i} T_i(A_0, A_1, A_{j-1}, a)$$"

and insert

--$$\sum_{a<A_i} T_i(A_0, A_1, A_{i-1}, a) \leq I_i < \sum_{a \leq A_i} T_i(A_0, A_1, A_{i-1}, a)$$--

In Column 17, Line 11, delete "11←1111," and insert --11→1111,--
In Column 17, Line 15, delete "11←1111," and insert --11→1111,--
In Column 19, Line 55, delete "following…" and insert --following:--
In Column 23, Line 8, delete "T2*(1+δ)*Rs/(Rs+8)" and insert --T2*(1+δ)*Rs/(Rs+δ)--
In Column 25, Line 6, delete "a" and insert --α--
In Column 26, Line 39, delete "a" and insert --α--
In Column 26, Line 64, delete "information . . ." and insert --information--
In Column 27, Line 52, delete "(Om)," and insert --(Qm),--
In Column 27, Line 56, delete "a" and insert --α--
In Column 28, Line 46, delete "a" and insert --α--
In Column 30, Line 28, delete "a" and insert --α--
In Column 31, Lines 33-34, delete "TB_CRC attachment←bit splitting←the specific coding segmentation and BG selection←CB segmentation." and insert --TB_CRC attachment→bit splitting→the specific coding segmentation and BG selection→CB segmentation.--
In Column 31, Line 54, delete "RES" and insert --REs--
In Column 31, Line 60, delete "n=floor (log2(TBS_temp–24))–5=7," and insert --n=floor(log2(TBS_temp–24))–5=7,--
In Column 32, Line 57, delete "RES" and insert --REs--
In Column 32, Line 61, delete "TBS_temp=N$_{RE}$*Roff*Q$_m$*v=3840." and insert --TBS_temp=N$_{RE}$*R$_{eff}$*Q$_m$*v=3840.--
In Column 33, Line 17, delete "RES" and insert --REs--
In Column 33, Lines 58-59, delete "R$_{eff}$–(Rs–1)*(m–1)/m+Rc= 4/15." and insert --R$_{eff}$=(Rs–1)*(m–1)/m+Rc= 4/15.--
In Column 33, Line 61, delete "TBS_temp=N$_{RE}$*Roff*Q$_m$*v=3840." and insert --TBS_temp=N$_{RE}$*R$_{eff}$*Q$_m$*v=3840.--
In Column 35, Lines 5-6, delete "SE$_{eff}$=R$_{eff}$×Qm=2 (m–1)×(Rd–1)+2m×Rc," and insert --SE$_{eff}$=R$_{eff}$×Q$_m$=2(m–1)×(Rd–1)+2m×Rc,--
In Column 36, Line 46, delete "floor (Kc/C)" and insert --floor(Kc/C)--
In Column 38, Line 15, delete "least . . ." and insert --least--
In Column 41, Line 56, delete "desirable . . ." and insert --desirable--

In the Claims

In Column 43, Line 20, in Claim 11, delete "second specific" and insert --specific--